United States Patent
Oliveti et al.

(10) Patent No.: US 12,080,520 B2
(45) Date of Patent: Sep. 3, 2024

(54) PLASMA GENERATION SYSTEMS WITH MULTI-DIMENSIONAL IMPEDANCE MATCHING NETWORKS

(71) Applicant: COMET TECHNOLOGIES USA, INC., San Jose, CA (US)

(72) Inventors: Anthony Oliveti, San Jose, CA (US); Dean Maw, San Jose, CA (US); Keith Rouse, San Jose, CA (US); Gary Russell, San Jose, CA (US); Tigran Poghosyan, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 160 days.

(21) Appl. No.: 18/080,547

(22) Filed: Dec. 13, 2022

(65) Prior Publication Data
US 2023/0104096 A1    Apr. 6, 2023

Related U.S. Application Data

(63) Continuation-in-part of application No. 17/458,764, filed on Aug. 27, 2021, now Pat. No. 11,574,799, and a continuation-in-part of application No. 17/244,193, filed on Apr. 29, 2021, now Pat. No. 11,527,385, said application No. 17/458,764 is a continuation of application No. 16/456,598, filed on Jun. 28, 2019, now Pat. No. 11,114,279.

(51) Int. Cl.
*H01J 37/32* (2006.01)

(52) U.S. Cl.
CPC . *H01J 37/32183* (2013.01); *H01J 2237/3322* (2013.01)

(58) Field of Classification Search
CPC ............... H01J 37/32183; H01J 2237/3322
See application file for complete search history.

(56) References Cited

U.S. PATENT DOCUMENTS

2013/0277333 A1* 10/2013 Misra ............... H01J 37/32183
                                                                216/61

\* cited by examiner

*Primary Examiner* — Henry Luong
(74) *Attorney, Agent, or Firm* — Nolte Lackenbach Siegel

(57) ABSTRACT

A plasma generation system includes an impedance matching network calibrated to map desired matching network impedance values to closest available settings of impedance control components. The tuning controller defines a set of target impedance values spaced-apart throughout the tuning range and drives the matching network to generate a set of closest frame tuning values proximate to each target impedance value. The tuning controller computes interpolated tuning values between adjacent pairs of frame tuning values and stores a tuning database that maps available matching network impedance values to specific sets of settings for the impedance control components. After the calibration stage, the tuning controller automatically utilizes the tuning database to map desired matching network impedance values to available settings of the impedance control components on an ongoing basis. Representative embodiments include variable loading and tuning capacitors in series with a fixed or variable phase-shift inductor.

17 Claims, 18 Drawing Sheets

PLASMA GENERATION SYSTEMS WITH MULTI-DIMENSIONAL IMPEDANCE MATCHING NETWORKS

CROSS-REFERENCE TO RELATED APPLICATION

This application is a Continuation-in-part claiming filing priority to U.S. patent application Ser. No. 17/244,193 filed Apr. 29, 2021 (U.S. Pat. No. 11,527,382 issued Dec. 13, 2022). This application is also a Continuation-in-part of claiming filing priority to U.S. patent application Ser. No. 17/458,764 filed Aug. 27, 2021, which is a Continuation of U.S. patent application Ser. No. 16/456,598 filed Jun. 28, 2019 (U.S. Pat. No. 11,114,279 granted Sep. 7, 2021). The contents of these applications are incorporated by reference.

TECHNICAL FILED

This application is related to plasma generation systems typically used for integrated circuit manufacturing and, more particularly, to plasma generation systems with multi-dimensional nonlinear impedance matching networks.

BACKGROUND

Radio frequency ("RF") plasma-enhanced processing is extensively used in semiconductor manufacturing to etch different types of films, deposit thin films at low to intermediate processing temperatures, and perform surface treatment and cleaning. One characteristic of such processes is the employment of a plasma, i.e., a partially ionized gas, that is used to generate neutral species and ions from precursors inside a reaction chamber, provide energy for ion bombardment, and/or perform other actions. Radio frequency plasma-enhanced processing is performed by what are known as radio frequency processing devices.

Radio frequency processing devices may include a radio frequency generator that transmits a signal to a plasma reaction chamber. A radio frequency matching device, which may have a variable impedance, may be located between the radio frequency generator and the plasma reaction chamber. The radio frequency matching device may be controlled, or otherwise tuned by varying the impedance of the radio frequency matching device. Tuning the radio frequency matching device reduces reflected power from the plasma reaction chamber and/or the radio frequency matching device, which may increase power that is transferred from the radio frequency generator to the plasma reaction chamber and into the plasma process.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
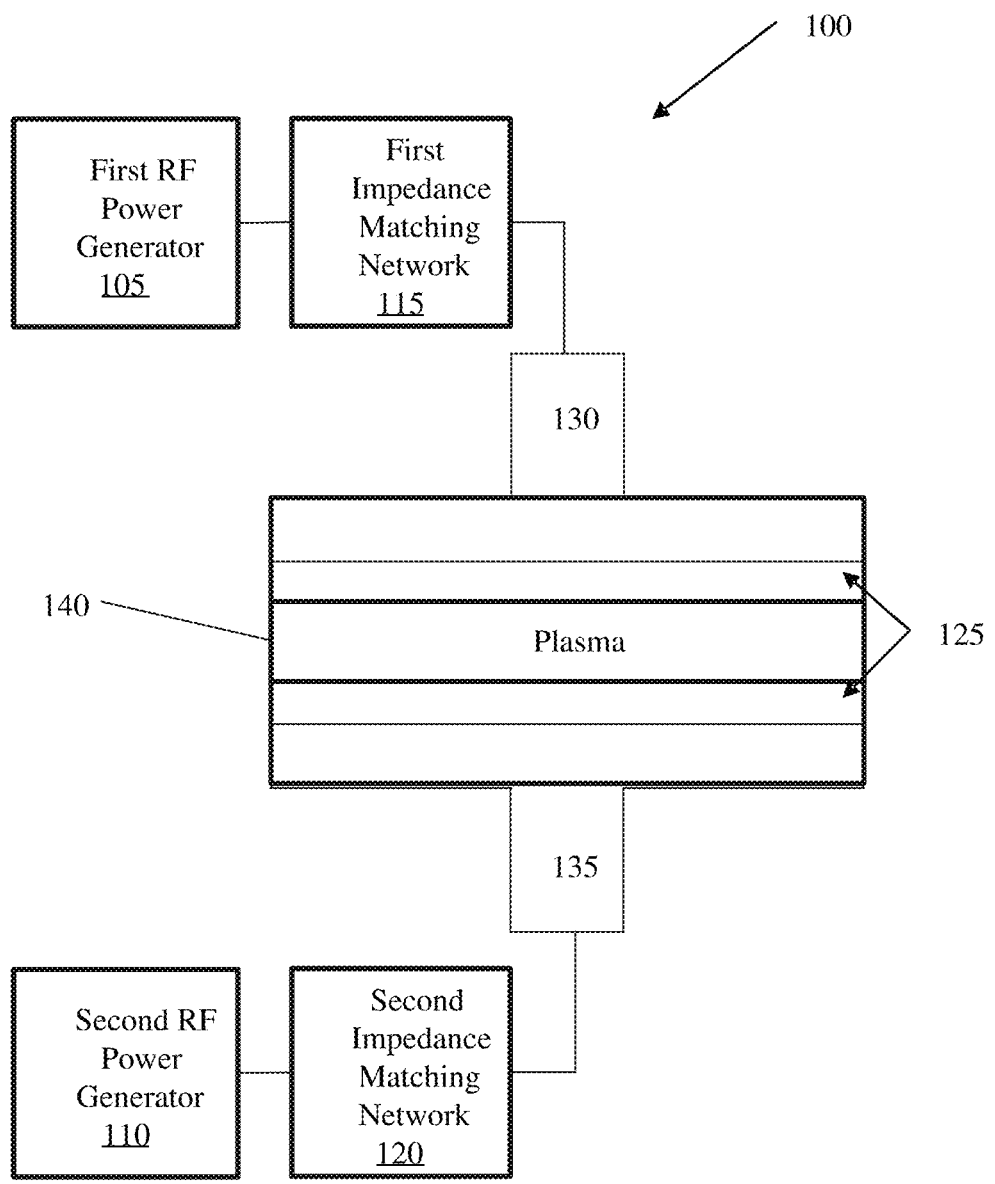
FIG. 1 is a block diagram representation of a radio frequency plasma processing device according to embodiments of the present disclosure.

Embodiments of the invention includes methods and systems for multi-dimensional calibration of impedance matching networks in plasma generation systems. Illustrative examples of the subject matter claimed below will now be disclosed. In the interest of clarity, not all features of an actual implementation are described for every example in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Embodiments of the present disclosure may provide systems and methods for tuning and otherwise controlling matching networks in radio frequency plasma processing devices. During operation, a radio frequency generator may be energized to form a plasma within a reaction chamber. The plasma may be produced after a source gas is injected into the reaction chamber and power is supplied within the reaction chamber by the radio frequency generator.

Under certain conditions, the power that is supplied to the reaction chamber may be reflected back from the reaction chamber. One cause of the reflected power may be a mismatch in the characteristic impedance of the system and the load formed by the plasma within the reaction chamber. To help prevent reflected power, a matching network may be disposed between the radio frequency generator and the reaction chamber. Such matching networks may include a number of variable capacitors or other impedance elements. The variable capacitors may be tuned so that the complex load impedance within the reaction chamber matches the impedance of the radio frequency generator.

While multiple methods of controlling or otherwise tuning matching networks have been used, such methods may not reliably and efficiently result in impedance matching. Matching networks may include stepper motors, which have a specific number of steps that are a function unique to a particular stepper motor. During operation, a capacitor may be driven by a motor that has a range between zero and one hundred percent and the motor may, as a result, have a number of clicks. Embodiments of the present disclosure may provide recipes and/or otherwise allow for the adjustment of a capacitor position based, at least in part, on "a steps to percent ratio."

Embodiments of the present disclosure may provide systems and methods for the calibration of matching networks using a steps to percent ratio to minimize, or at least address, the currently experienced problems identified above. For example, addressing the above issues may include adjusting a property of one or more capacitors within the matching network.

Turning to FIG. 1, a side view block diagram representation of a radio frequency plasma processing system 100 is illustrated, according to embodiments of the present disclosure. Radio frequency plasma processing system 100 includes a first radio frequency generator 105 and a second radio frequency generator 110, a first impedance matching network 115, a second impedance matching network 120, a sheath 125, a plasma powering device, such as showerhead 130 or equivalent powered element such as an electrode, and a pedestal 135. As used herein, plasma power devices may refer to any device that introduces power to generate plasma and may include, for example, showerhead 130 and/or other types of electrodes, as well as antennae and the like.

Radio frequency plasma processing system 100 may include one or more first and second radio frequency generators 105, 110 that deliver power to a reaction chamber 140 through one or more impedance matching networks 115, 120. In this example, radio frequency power flows from the first radio frequency generator 105 through the first impedance matching network 115 to showerhead 130 into plasma in reaction chamber 140, to an electrode (not shown) other than showerhead 130, or to an inductive antenna (not shown) that electromagnetically provides power to the plasma. After which the power flows from the plasma to ground and/or to pedestal 135 and/or to second impedance matching network 120. Generally, first impedance matching network 115 compensates for variations in a load impedance inside reaction chamber 140 so the combined impedance of showerhead 130 and first impedance matching network 115 is equal to the optimal load impedance of the first radio frequency generator 105 by adjusting the reactive components (not separately shown), e.g., variable capacitors, within first impedance matching network 115.

In certain examples, first radio frequency generator 105 may provide power at a RF frequency between about 400 KHz and 150 MHz, while second radio frequency generator 110 connected to pedestal 135 may supply power at a radio frequency lower than that of first radio frequency generator 105. However, in certain implementations, second radio frequency generator 110 may not supply power at a radio frequency lower than that of first radio frequency generator 105. Typically, the frequencies of first and second radio frequency generators 105, 110 are such that first radio frequency generator 105 is at a radio frequency that is not an integer multiple, nor integer fraction, of the frequency of second radio frequency generator 110.

Impedance matching networks 115, 120 are designed to adjust their internal reactive elements such that the load impedance matches the source impedance. In other examples of the plasma processing device 100, different numbers of radio frequency power generators 105/110 may be used, as well as different numbers of impedance matching networks 115/120. Impedance matching networks 115/120 may include a number of internal components, such as coils and variable capacitors, which will be discussed in greater detail below.

Figure 2:
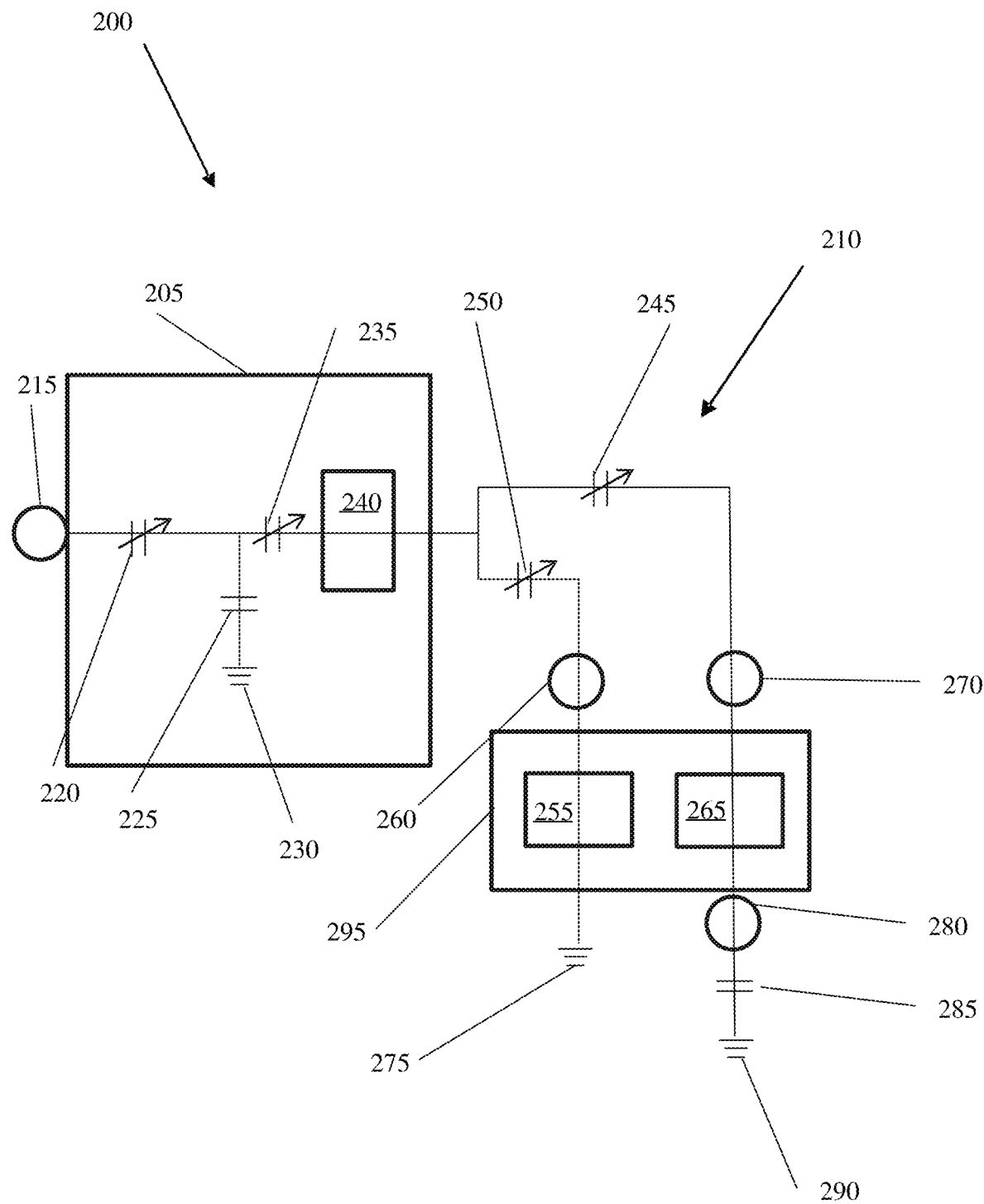
FIG. 2 is a schematic representation of a matching network according to embodiments of the present disclosure.

Turning to FIG. 2, a schematic representation of a matching network according to embodiments of the present disclosure is shown. In this embodiment, a matching network 200, such as those described above with respect to FIG. 1, is illustrated having a matching branch 205 and a splitter branch 210. Matching branch 205 receives radio frequency power from an input 215. A first variable capacitor 220 of the matching branch 205 receives the radio frequency power from the input 215. First variable capacitor 220 may include a capacitor rated at approximately 10-2000 pF.

First variable capacitor 220 is connected to a second capacitor 225, which is connected to a ground 230. Second capacitor 225 is also connected to a third variable capacitor 235. Third variable capacitor 235 may include a capacitor rated at approximately 10-2000 pF. Third variable capacitor 235 is also connected to an inductor 240, which further connects to splitter branch 210.

Splitter branch 210 receives radio frequency power from matching branch 205, which, splits the received radio frequency power between a fourth variable capacitor 245 and a fifth variable capacitor 250. Fourth variable capacitor 245 may be rated at approximately 10-2000 pF, while fifth variable capacitor 250 may be rated at approximately 10-2000 pF.

Fifth variable capacitor 250 is connected to an inner coil 255. Between fifth variable capacitor 245 and inner coil 255, one or more sensors 260 may be disposed. Sensor 260 may be used to measure, for example, voltage between fifth variable capacitor 250 and ground 275. Similarly, fourth variable capacitor 245 is connected to an outer coil 265. Between fourth variable capacitor 245 and outer coil 265, one or more sensors 270 may be disposed. Sensors 270 may be used to measure, for example, voltage between fourth variable capacitor 245 and ground 290.

Inner coil 255 may further be connected to a ground 275 and outer coil 265 may be connected to circuitry that includes a sensor 280 and a sixth capacitor 285. Sensor 280 may be used to measure, for example, voltage between outer coil 265 and ground 290. Inner coil 255 and outer coil 265 may be located outside of the matching network 200 circuitry, as indicated by offset box 295.

As discussed above, the circuitry illustrated in FIG. 2 may be used to tune first variable capacitor 220, third variable capacitor 235, fourth variable capacitor 245, and fifth variable capacitor 250. By tuning first variable capacitor 220, third variable capacitor 235, fourth variable capacitor 245, and fifth variable capacitor 250 the power provided to inner coil 255 and outer coil 265 may be adjusted.

The circuitry, which in one embodiment may be employed in matching network 200 as a current split ratio matching network, may be controlled using a programmable logic controller (not shown), which may be disposed in or otherwise connected to matching network 200. Suitable programmable logic controllers and associated components will be discussed further with respect to FIG. 3.

In other embodiments, the circuitry of matching network 200 may include fewer or additional components, and the orientation of the circuitry may differ. For example, fewer or greater numbers of variable capacitors, inductors, sensors, and the like may be present. Additionally, in certain embodiments, a different orientation of coils, antennas, and the like may be used to provide tuned radio frequency power to a reaction chamber (not shown in FIG. 2). Systems and methods disclosed herein may be used inductively coupled plasmas ("ICPs"), capacitively coupled plasmas ("CCPs"), helicon wave sources ("HWSs"), or any other plasma processing devices.

Figure 3:
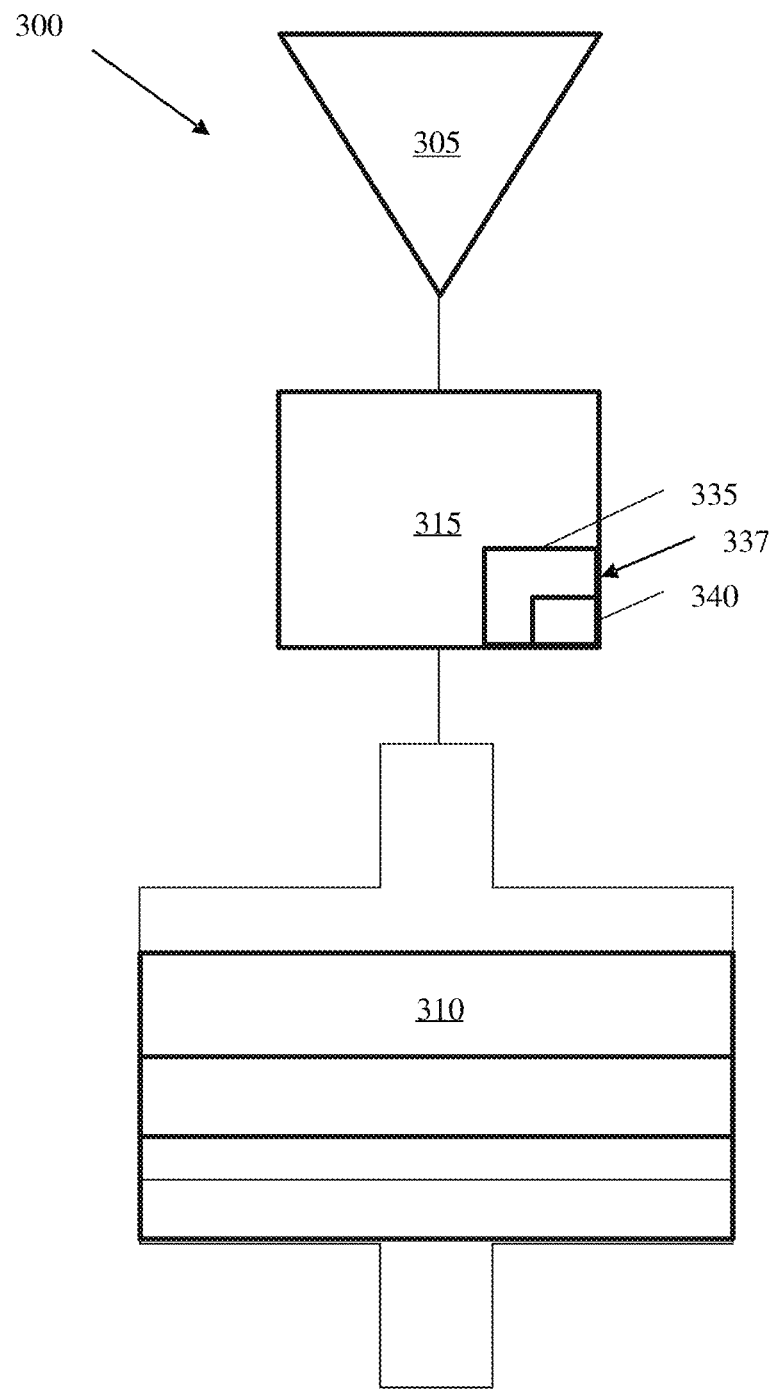
FIG. 3 is a schematic representation of a plasma processing device according to embodiments of the present disclosure.

Turning to FIG. 3, a schematic representation of a radio frequency plasma processing device 300 according to embodiments of the present disclosure is shown. In this embodiment, radio frequency plasma processing device 300 includes a radio frequency generator 305. Radio frequency generator 305 is configured to provide power to reaction chamber 310. Radio frequency generator 305 may provide power at a radio frequency between about 400 KHz and about 150 MHz. In certain embodiments, a second radio frequency generator (not shown) may also be present within radio frequency plasma processing device 300 and may provide power at a radio frequency that is the same, lower, or higher than radio frequency generator 305.

Reaction chamber 310 may include various components that allow for the processing of a manufacturing operation, such as those associated with the semiconductor industries. Reaction chamber 310 may include one or more sensors (not shown) for measuring certain properties occurring within reaction chamber 310. Reaction chamber 310 may also include a pedestal (also not shown) on which substrates to be manufactured may be placed during operation. Reaction chamber 310 may also include or otherwise be connected to coils (not individually shown), such as those discussed above, as well as showerheads, etc.

Radio frequency plasma processing device 300 may also include a matching network 315. Matching network 315 may be located between radio frequency generator 305 and reaction chamber 310. Matching network 315 may include variable capacitors (not shown), as well as other components to balance impedance between radio frequency generator 305 and reaction chamber 310, as discussed in greater detail above. During operation, the matching network may be tuned, e.g., by adjusting capacitor positions, in order to provide the matching impedances.

During operation, as power is supplied from radio frequency generator 305 to a plasma (not shown) within reaction chamber 310, a condition may occur, such as power may be reflected from reaction chamber 310. Such reflected power may result in undesirable conditions, which result in inefficient processing, damage to a substrate, damage to components of radio frequency plasma processing device 300, and the like. To resolve the condition and improve operability of radio frequency processing device 300, a tuning module 337 includes programmable logic controller 335 that may provide commands to matching network 315 to adjust a capacitor position, thereby providing matching impedances to minimize reflected power. Programmable logic controller 335 may be connected to storage device 340 to store these commands or data obtained during operation.

During operation, programmable logic controller 335 may identify a capacitor within matching network 315. The identifying may occur automatically or be controlled by an operator. Along with identifying the capacitor, the impedance of the matching network as a whole may be measured. Measuring the impedance of matching network 315 as a whole may include measuring a plurality of impedance values for one or more capacitors and/or other components within matching network 315. The capacitor may be driven from a zero step value, which represents the point of minimum capacitance within its usable range. For example, in certain embodiments, the predefined step value may be about two thousand steps, while in other embodiments, the predefined step value may be more or less than two thousand steps. During operation, the capacitor is not actually used in all two thousand steps and/or the number of steps defined by the predefined step value. However, by determining the impedance at each step value, where the number of steps is determined by specifics of the operation and may vary between, for example, one and two thousand or more, the impedance for specific capacitor positions within matching network 315 may be identified.

After the impedance is measured for each step, the impedance for particular capacitor positions may be saved in, for example, a table or database, which may be used during operation to adjust operation of matching network 315. As such, the impedance for a particular capacitor position may be referenced during operation of matching network 315. Thus, as capacitor positions are adjusted within matching network 315, the capacitor positions may be adjusted based on a predefined impedance curve, as set forth within a table and/or database that may be stored on memory associated with programmable logic controller 335. Using the measured impedance for each position of the capacitors for matching network 315, a table is constructed of the reported positions of the capacitors, thereby optimizing the initial tuning conditions for a plasma processing recipe.

As explained above, during operation, the capacitor is not used in every step, rather, the capacitor is generally used within a selected region. Using the embodiments provided herein, a region of usage for a specific capacitor may be identified, and as such, the steps per percent usage of a capacitor may be identified. By identifying the region where a capacitor is used, the steps to percent usage ratio may be increased, thereby increasing the repeatability of capacitor position during operation. For example, in certain embodiments, a range of step values may be identified where the capacitor position occurs about ninety percent of a time period. In other embodiments, the time period may include capacitor position location more than fifty percent, more than sixty percent, more than seventy percent, more than eighty percent more than ninety-five percent, etc. By identifying the range of usage within matching network 315 for one or more operations, the steps percent to usage ratio may be increased, thereby increasing the repeatability of capacitor position reporting. Accordingly, in certain embodiments, a steps per percent usage ratio may be stored in the database/data structure and used to improve reported capacitor position repeatability.

Figure 4:
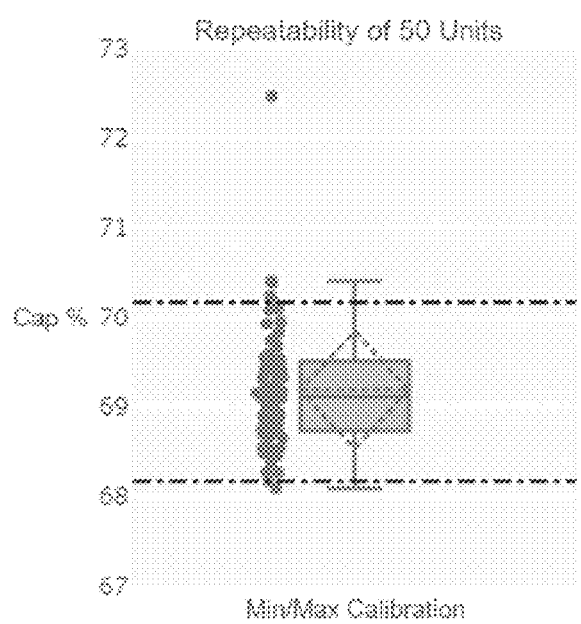
FIG. 4 is a graph/plot illustrating use of a minimum and a maximum capacitance point for a radio frequency plasma processing device.
Figure 5:
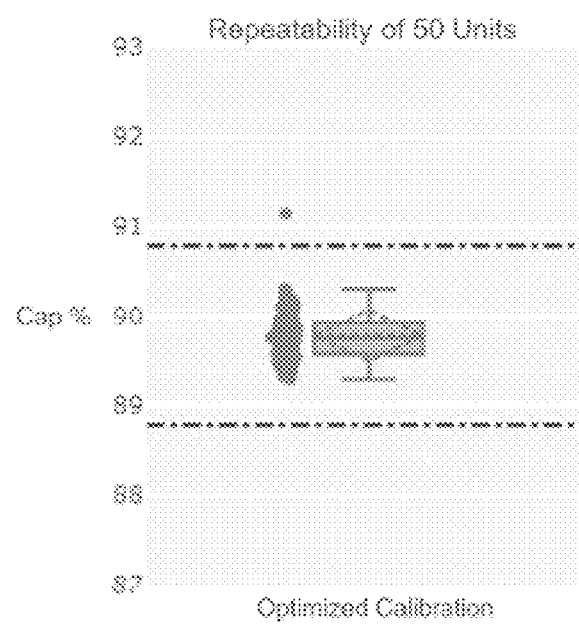
FIG. 5 is a graph/plot illustrating use of reported capacitor positions based on network impedance according to embodiments of the present disclosure.

Turning to FIGS. 4 and 5, a graph using minimum and maximum capacitance points and a graph using reported capacitor positions based on network impedance, respectively, according to embodiments of the present disclosure are shown. FIG. 4 illustrates the repeatability of capacitor position based on minimum and maximum capacitance points for a sample size of fifty. As illustrated, using about twenty steps per percent ratio using minimum and maximum values results in a relatively wide band of capacitor positions.

FIG. 5 illustrates using reported capacitor positions based on network impedance according to embodiments of the present disclosure. By optimizing the steps to percent usage ratio, less than twenty steps may be used for the actual usage of the capacitor when determining optimized capacitor position. As such, capacitor position for a particular operation may be more repeatably applied because the actual usage of the capacitor during operation is considered rather than only minimum and maximum values.

Figure 6A:
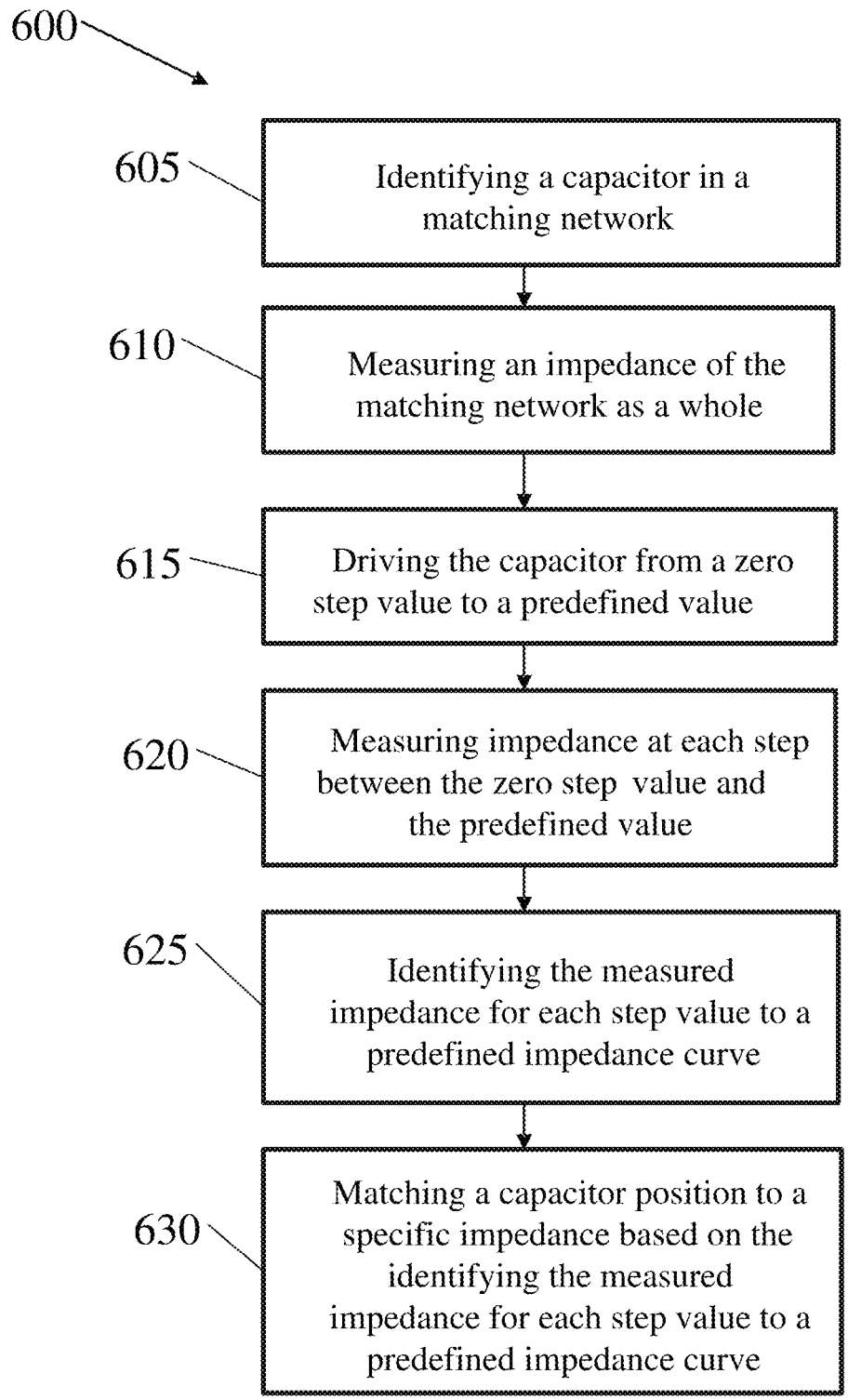
FIG. 6A is a flowchart of one example method for tuning a matching network in a radio frequency plasma processing device according to embodiments of the present disclosure.

Turning to FIG. 6A, a flowchart of a method 600 for calibrating a matching network in a radio frequency plasma processing device, according to embodiments of the present disclosure is shown. The method 600 may include identifying (block 605) a capacitor in the matching network. The identifying may include determining a specific capacitor within a matching network and/or may include determining more than one capacitor within the matching network. The capacitors may include variable capacitors, such as those discussed above.

During operation, method 600 may further include measuring (block 610) the impedance of the matching network as a whole. Measuring the impedance of the matching network may include measuring specific capacitors, multiple capacitors in a matching network, and/or measuring other aspects of a radio frequency plasma processing device. The measuring may include using one or more sensors within a radio frequency plasma processing device to determine a total impedance within the matching network.

During operation, method 600 may further include driving (block 615) the capacitor from a zero step value to a predefined step value. The predetermined step value may vary depending on the operational constraints of the radio frequency plasma processing device, including the specific operational aspects of the matching network. In certain embodiments the predefined step value may include at least two thousand steps, while in other embodiments, there may be more or less than two thousand steps. By driving the capacitor, capacitor positions may be determined for specific step values, thereby allowing aspects of the radio frequency plasma processing device to be analyzed.

During operation, method 600, may further include measuring (block 620) impedance at each step between the zero step value and the predefined step value. By measuring the impedance at each step, an impedance for each capacitor position may be determined. The measuring may also include determining that step values where the capacitor operates for specific conditions. For example, the capacitor may be in a particular position the majority of the time it is in operation. For commonly used conditions, a higher steps per percentage ratio is used, thereby reporting increased accuracy and repeatability of capacitor positions.

During operation, method 600 may further include identifying (block 625) the measured impedance for each step value to a predefined impedance curve. The predefined impedance curve may include a known value based on prior testing and/or diagnostics for a capacitor and/or a capacitor within a matching network and/or radio frequency plasma processing device.

During operation, method 600 may further include matching (block 630) a capacitor position to a specific impedance based on the identifying the measured impedance for each step value to a predefine impedance curve. When the range of capacitor positions are known for a specific capacitor within a matching network, the capacitor positions may be tuned in order to increase the repeatability of obtaining a correct and/or optimized capacitor position for a particular operation. Accordingly, optimizing a step value per percent usage of the capacitor at a particular location for a particular operation may thereby further increase the repeatability for a matching network. By using the most used operational range for a capacitor within a matching network the steps per percentage ratio may be optimized, thereby increasing the repeatability of capacitor positions during operation of the matching network.

Figure 6B:
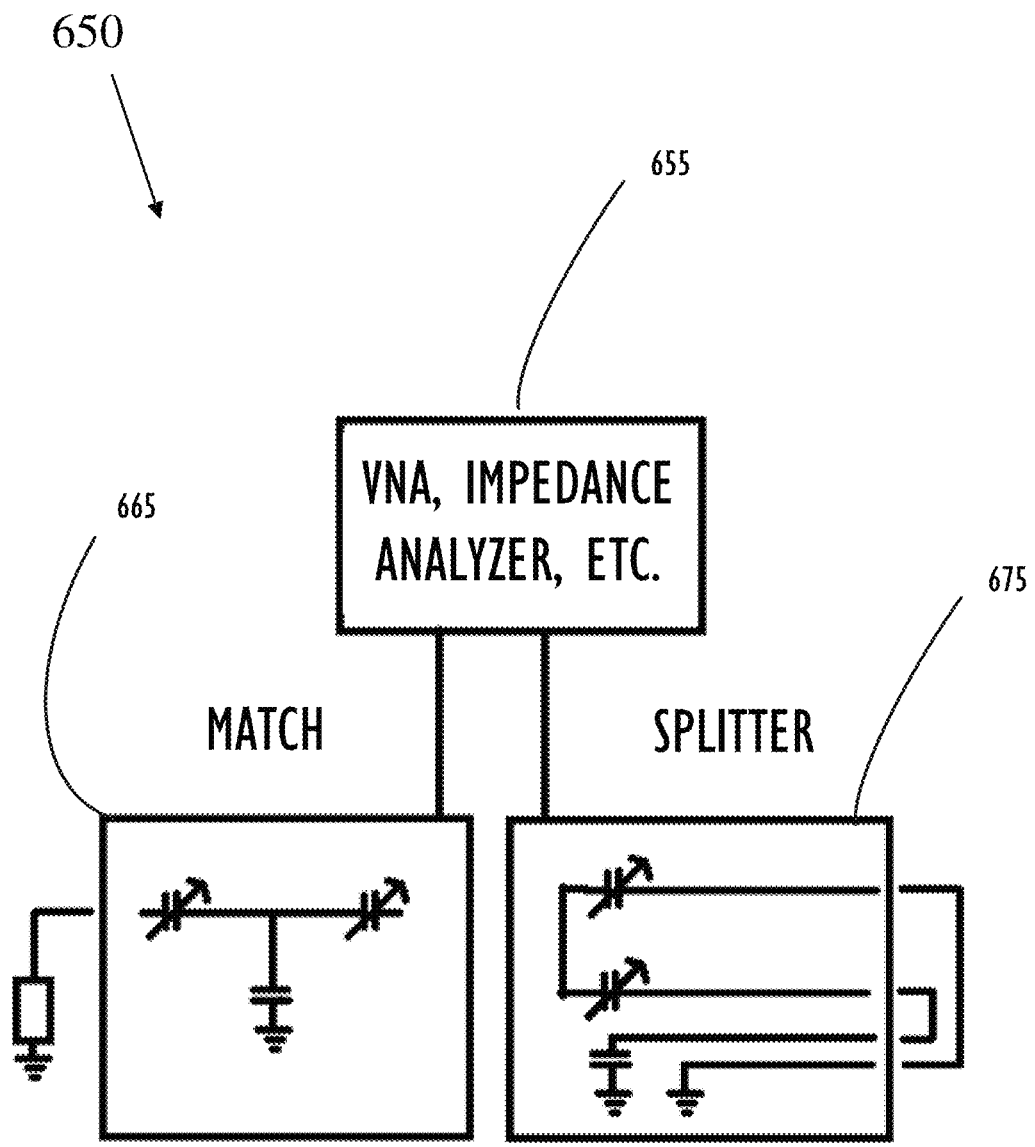
FIG. 6B is a block diagram of components that may be used to implement the method of FIG. 6A according to embodiments of the present disclosure.

FIG. 6B illustrates a block diagram 650 that includes multiple components that may be used to implement method 600. Specifically block diagram 650 illustrates one possible relationship between an impedance analyzer 655, a match component 665, and a splitter 675.

Figure 7:
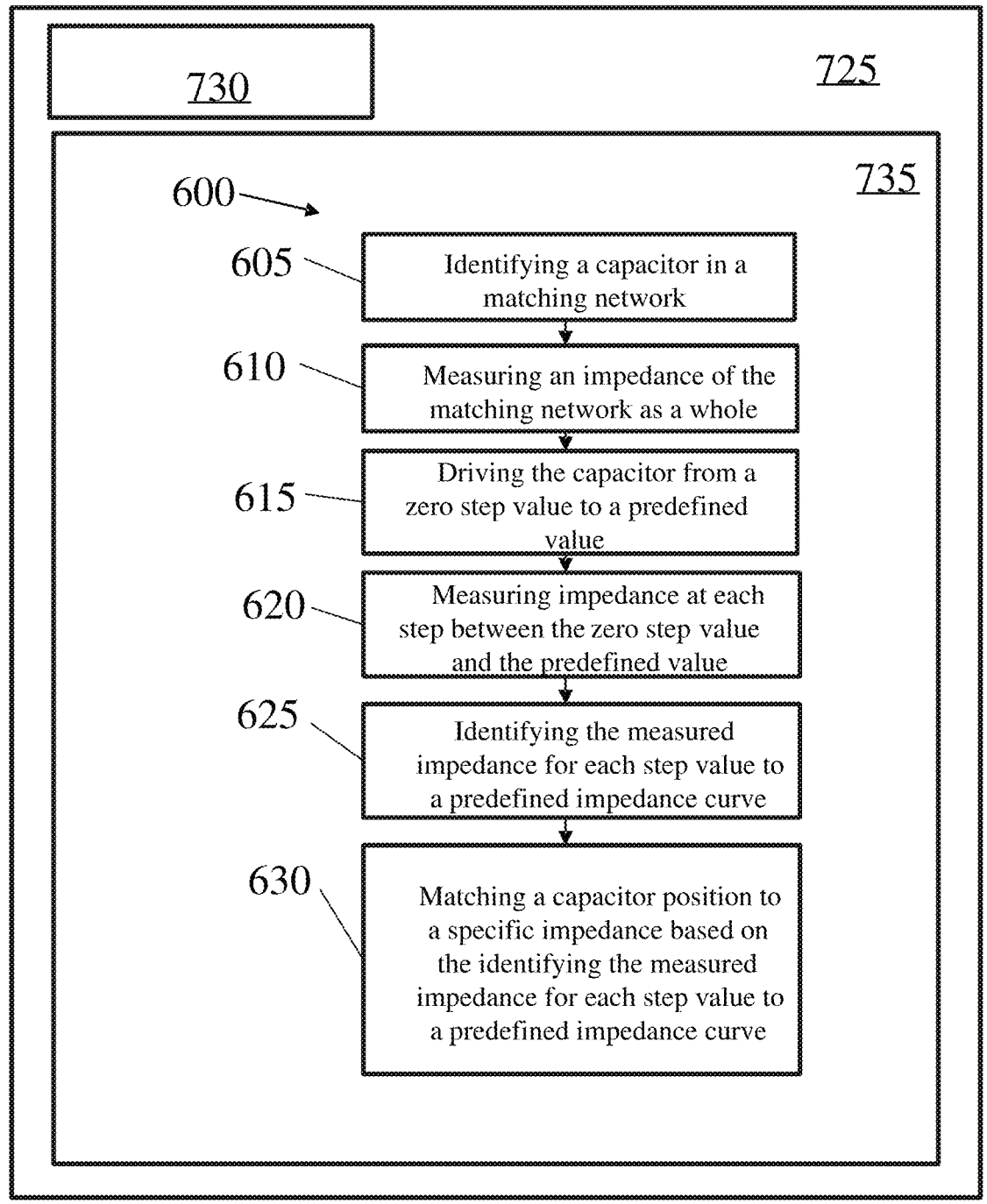
FIG. 7 is an example computing device with a hardware processor and accessible machine-readable instructions (e.g., instructions stored in a non-transitory computer readable medium) in accordance with one or more examples of the present disclosure.

Turning now to FIG. 7, an example computing device with a hardware processor and accessible machine-readable instructions 600 is shown in accordance with one or more examples of the present disclosure. FIG. 7 provides the same aspects discussed above with respect to FIG. 6, and as such, for purposes of clarity, only the differences in the figures will be discussed herein. FIG. 7 provides an example computing device 725, with a hardware processor 730, and accessible machine-readable instructions stored on a machine-readable medium 735 for managing data as discussed above with respect to one or more disclosed example implementations. FIG. 6 illustrates computing device 725 configured to perform the flow described in blocks 605, 610, 615, 620, 625, and 630 discussed in detail with respect to FIG. 6. However, computing device 725 may also be configured to perform the flow of other methods, techniques, functions, or processes described in this disclosure.

Figure 8:
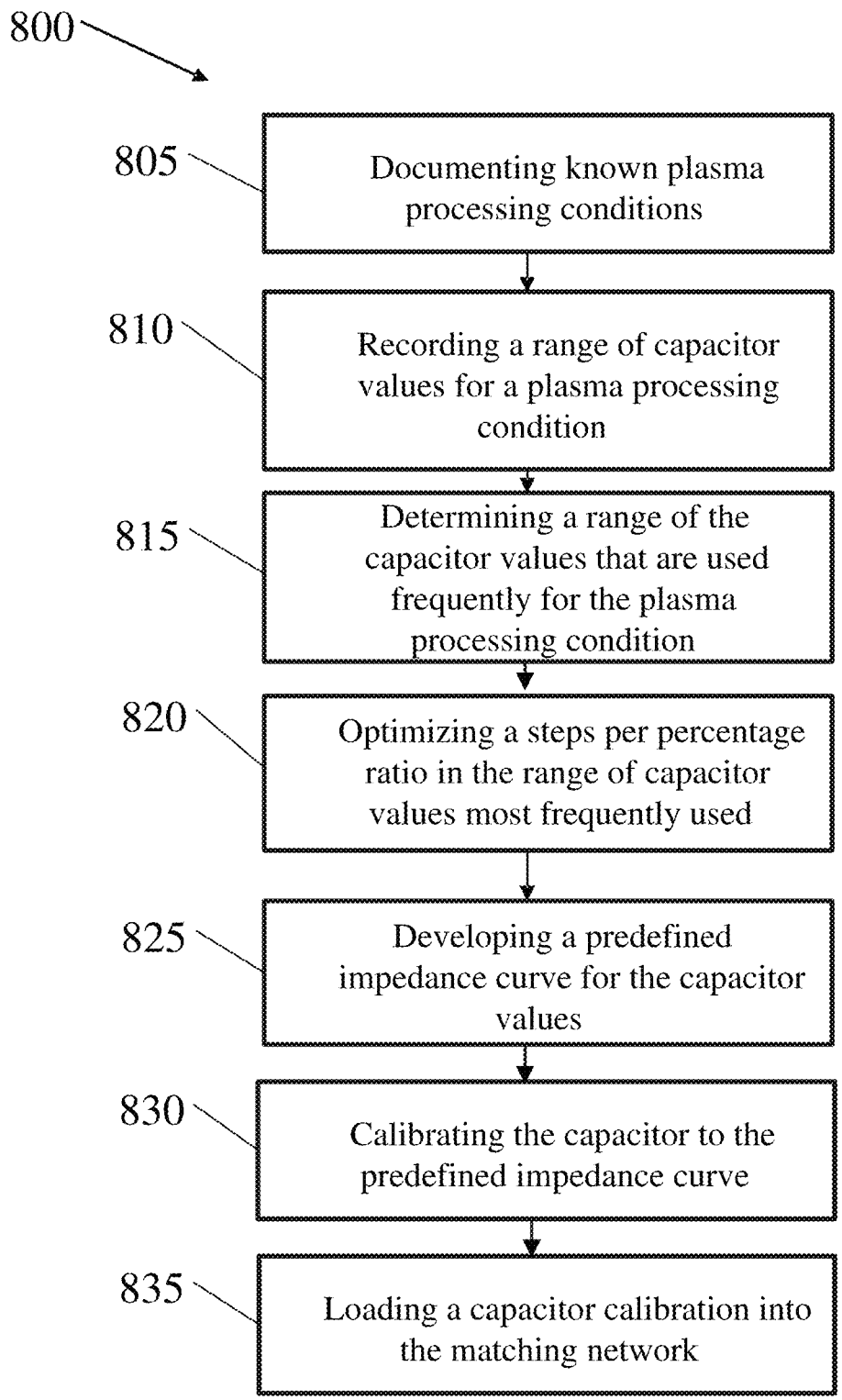
FIG. 8 is a flowchart of one example method for tuning a matching network in a radio frequency plasma processing device according to embodiments of the present disclosure.

Turning to FIG. 8, a flowchart of a method for calibrating a matching network in a radio frequency plasma processing device, according to embodiments of the present disclosure is shown. During operation, method 800 may include calibrating a capacitor in a matching network in a radio frequency plasma processing device. The method 800 may include documenting (805) known plasma processing conditions.

During operation, method 800 may further include recording (block 810) for a range of capacitor values for a plasma processing condition. Method 800 may further include determining (block 815) a range of the capacitor values that are used frequently for the plasma processing condition.

During operation, method 800 may further include optimizing a steps per percentage ratio in the rage of capacitor values most frequently used. Method 800 may further include developing (block 825) a predefined impedance curve for the capacitor values.

During operation, method 800 may further include calibrating (block 830) the capacitor to the predefined impedance curve. Method 800 may further include loading (block 835) a capacitor calibration into the matching network.

Figure 9:
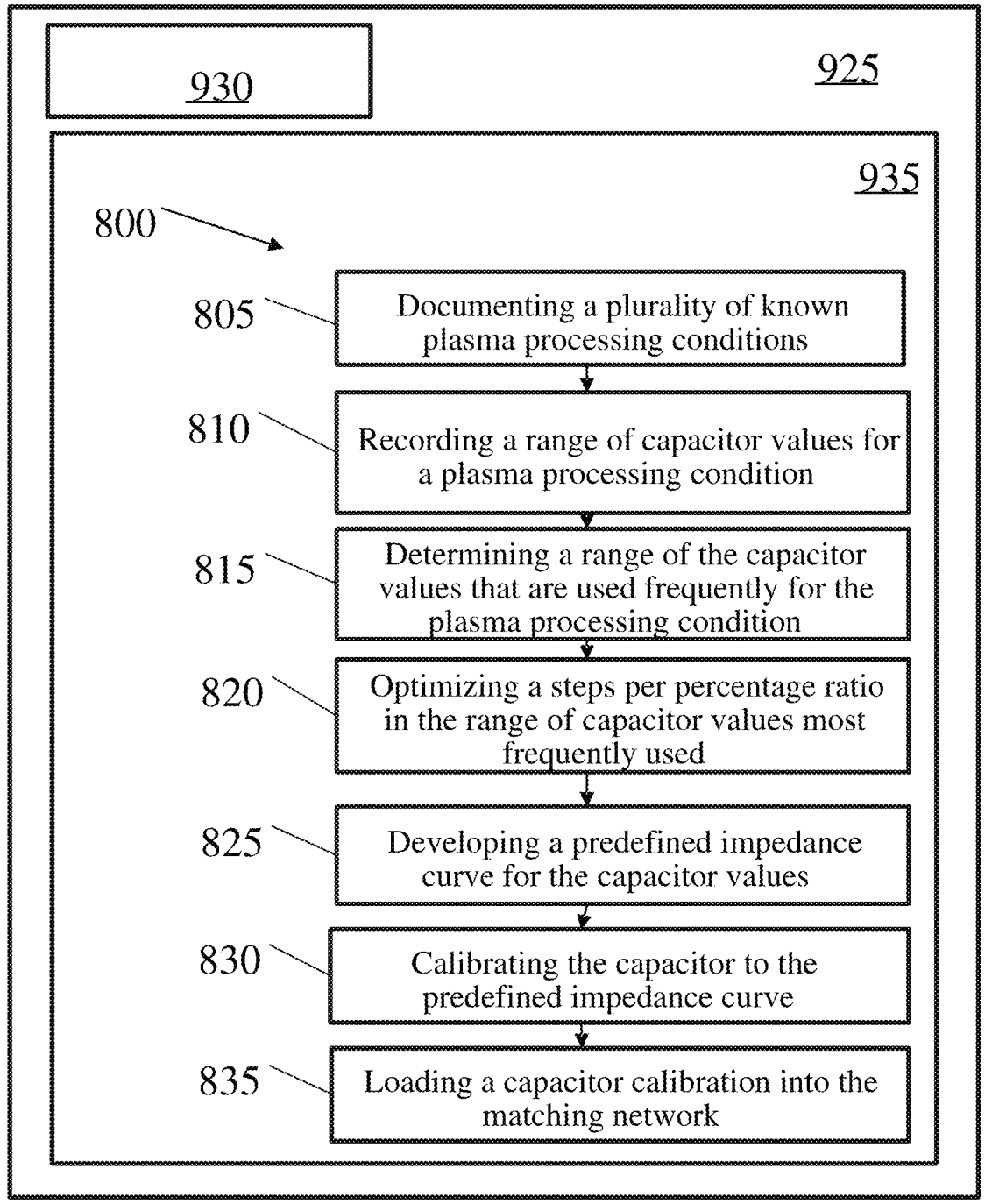
FIG. 9 is an example computing device with a hardware processor and accessible machine-readable instructions (e.g., instructions stored in a non-transitory computer readable medium) in accordance with one or more examples of the present disclosure.

Turning now to FIG. 9, an example computing device with a hardware processor and accessible machine-readable instructions is shown in accordance with one or more examples of the present disclosure. FIG. 9 provides the same structural components discussed above with respect to FIG. 8, and as such, for purposes of clarity, only the differences in the figures will be discussed herein. FIG. 9 provides an example computing device 925, with a hardware processor 930, and accessible machine-readable instructions stored on a machine-readable medium 935 for managing data as discussed above with respect to one or more disclosed example implementations. FIG. 8 illustrates computing device 925 configured to perform the flow described in blocks 805, 810, 815, 820, 825, 830, and 835 discussed in detail with respect to FIG. 8. However, computing device 925 may also be configured to perform the flow of other methods, techniques, functions, or processes described in this disclosure.

Figure 10:
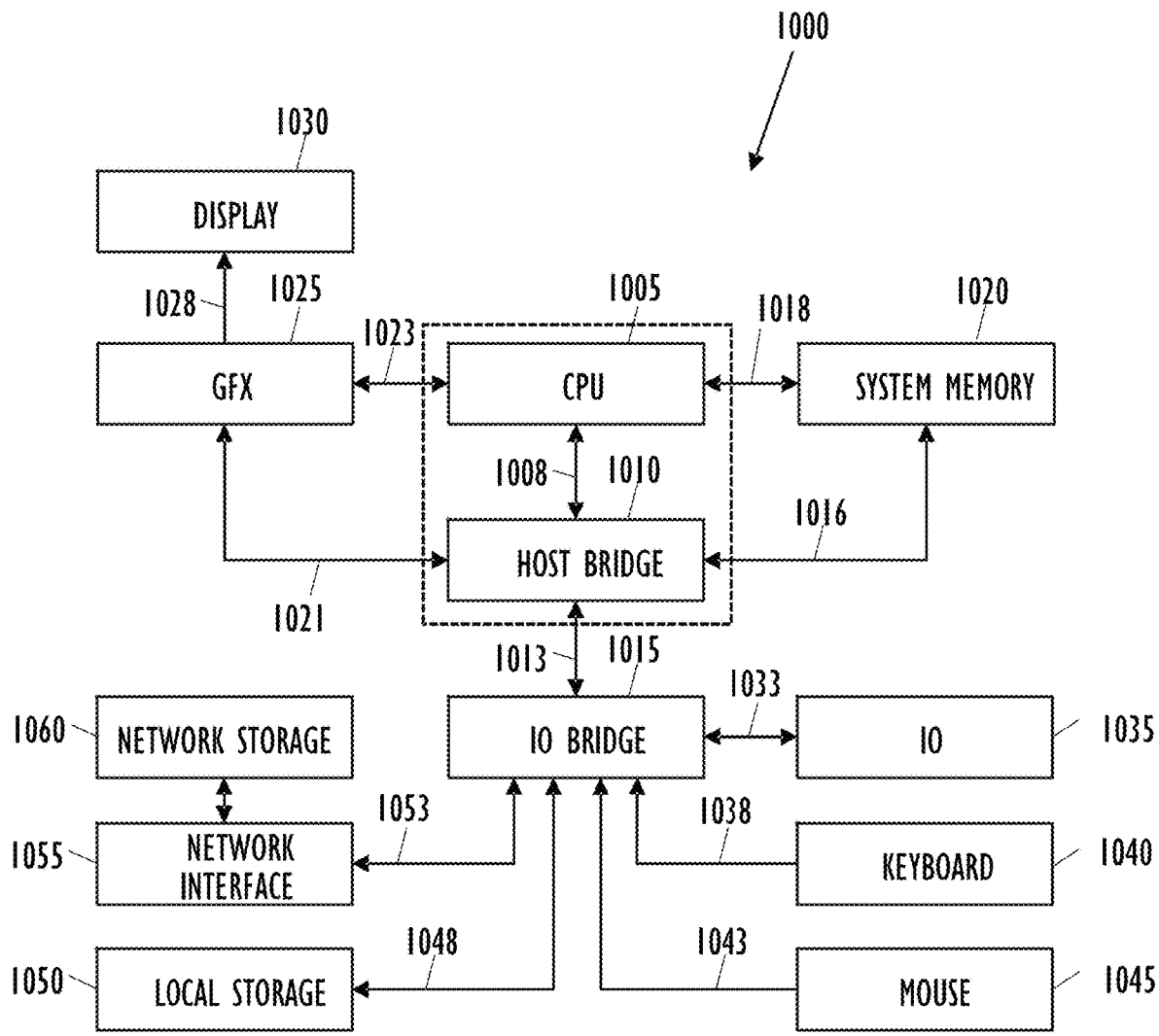
FIG. 10 is a schematic representation of a computer processing device that may be used to implement functions and processes in accordance with one or more examples of the present disclosure.

Referring now to FIG. 10, a schematic representation of a computer processing device 1000 that may be used to implement functions and processes in accordance with one or more examples of the present disclosure is shown. FIG. 10 illustrates a computer processing device 1000 that may be used to implement the systems, methods, and processes of this disclosure. For example, computer processing device 1000 illustrated in FIG. 10 could represent a client device or a physical server device and include either hardware or virtual processor(s) depending on the level of abstraction of the computing device. In some instances (without abstraction), computer processing device 1000 and its elements, as shown in FIG. 10, each relate to physical hardware. Alternatively, in some instances one, more, or all of the elements could be implemented using emulators or virtual machines as levels of abstraction. In any case, no matter how many levels of abstraction away from the physical hardware, computer processing device 1000 at its lowest level may be implemented on physical hardware. In one implementation, computer processing device 1000 may allow a subscriber to remotely access one or more data centers. Similarly, the management tool used by the subscriber may include a software solution that runs on such a computer processing device 1000.

FIG. 10 shows a computer processing device 1000 in accordance with one or more examples of the present disclosure. Computer processing device 1000 may be used to implement aspects of the present disclosure, such as aspects associated with the tuning module, the matching network, or other components of a radio frequency plasma processing device. Computer processing device 1000 may include one or more central processing units (singular "CPU" or plural "CPUs") 1005 disposed on one or more printed circuit boards (not otherwise shown). Computer processing device 1000 may further include any type of processing deice or programmable logic controller known in the art. Computer processing device 1000 may also perform the functions of a controller, as a processor, and be used according to the methods and systems described above with respect to FIGS. 1-9. As such, computer processing device 1000 may be a controller, processor, perform the functions of the controller and/or processor, and may be used to determine capacitor positions within a matching network.

Each of the one or more CPUs 1005 may be a single-core processor (not independently illustrated) or a multi-core processor (not independently illustrated). Multi-core processors typically include a plurality of processor cores (not shown) disposed on the same physical die (not shown) or a plurality of processor cores (not shown) disposed on multiple die (not shown) that are collectively disposed within the same mechanical package (not shown). Computer processing device 1000 may include one or more core logic devices such as, for example, host bridge 1010 and input/output ("IO") bridge 1015.

CPU 1005 may include an interface 1008 to host bridge 1010, an interface 1018 to system memory 1020, and an interface 1023 to one or more IO devices, such as, for example, graphics processing unit ("GFX") 1025. GFX 1025 may include one or more graphics processor cores (not independently shown) and an interface 1028 to display 1030. In certain embodiments, CPU 1005 may integrate the functionality of GFX 1025 and interface directly (not shown) with display 1030. Host bridge 1010 may include an interface 1008 to CPU 1005, an interface 1013 to IO bridge 1015, for embodiments where CPU 1005 does not include interface 1018 to system memory 1020, an interface 1016 to system memory 1020, and for embodiments where CPU 1005 does not include integrated GFX 1025 or interface 1023 to GFX 1025, an interface 1021 to GFX 1025.

One of ordinary skill in the art will recognize that CPU 1005 and host bridge 1010 may be integrated, in whole or in part, to reduce chip count, motherboard footprint, thermal design power, and power consumption. IO bridge 1015 may include an interface 1013 to host bridge 1010, one or more interfaces 1033 to one or more IO expansion devices 1035, an interface 1038 to keyboard 1040, an interface 1043 to mouse 1045, an interface 1048 to one or more local storage devices 1050, and an interface 1053 to one or more network interface devices 1055.

Each local storage device 1050 may be a solid-state memory device, a solid-state memory device array, a hard disk drive, a hard disk drive array, or any other non-transitory computer readable medium. Each network interface device 1055 may provide one or more network interfaces including, for example, Ethernet, Fibre Channel, WiMAX, Wi-Fi, Bluetooth, EtherCAT, Device Net, Mod Bus, RS-232, or any other network protocol suitable to facilitate networked communications. Computer processing device 1000 may include one or more network-attached storage devices 1060 in addition to, or instead of, one or more local storage devices 1050. Network-attached storage device 1060 may be a solid-state memory device, a solid-state memory device array, a hard disk drive, a hard disk drive array, or any other non-transitory computer readable medium. Network-attached storage device 1060 may or may not be collocated with computer processing device 1000 and may be accessible to computer processing device 1000 via one or more network interfaces provided by one or more network interface devices 1055.

One of ordinary skill in the art will recognize that computer processing device 1000 may include one or more application specific integrated circuits ("ASICs") that are configured to perform a certain function, such as, for example, hashing (not shown), in a more efficient manner. The one or more ASICs may interface directly with an interface of CPU 1005, host bridge 1010, or IO bridge 1015. Alternatively, an application-specific computing device (not shown), sometimes referred to as mining systems, may be reduced to only those components necessary to perform the desired function, such as hashing via one or more hashing ASICs, to reduce chip count, motherboard footprint, thermal design power, and power consumption. As such, one of ordinary skill in the art will recognize that the one or more CPUs 1005, host bridge 1010, IO bridge 1015, or ASICs or various sub-sets, super-sets, or combinations of functions or features thereof, may be integrated, in whole or in part, or distributed among various devices in a way that may vary based on an application, design, or form factor in accordance with one or more example embodiments. As such, the description of computer processing device 1000 is merely exemplary and not intended to limit the type, kind, or configuration of components that constitute a computing device suitable for performing computing operations, including, but not limited to, hashing functions. Additionally, one of ordinary skill in the art will recognize that computing device 1000, an application specific computing device (not shown), or combination thereof, may be disposed in a standalone, desktop, server, or rack mountable form factor.

Illustrative embodiments of the innovative plasma generation systems include impedance matching networks calibrated to map desired matching network impedance values to specific available settings of the impedance control components, in view of the limited number of available settings of the impedance control components (also referred to as "tuning values"). To create a large tuning database from a more manageable set of measured calibration points, the tuning controller defines a set of target impedance values spaced-apart throughout the tuning range. The tuning controller drives the matching network to generate a closest frame tuning value proximate to each target impedance value. The tuning controller then computes interpolated tuning values between adjacent pairs of measured frame tuning values and stores a multi-dimensional tuning database mapping the matching network impedance values to the specific sets of tuning values (i.e., one tuning value for each impedance control component), in view of the limited number of available settings of the impedance control components. A two-dimensional embodiment includes two adjustable capacitors referred to as the loading capacitor and the tuning capacitor. Another three-dimensional embodiment includes a variable inductor in addition to the variable loading and tuning capacitors. The impedance control components in additional illustrative embodiments may include one or more shunt control legs containing switching elements, variable capacitors, variable inductors, variable resistors (varistors), and/or other suitable impedance control components.

After the calibration stage, the tuning procedure for the matching network continually measures the load impedance and/or the combined load impedance and adjusts the settings of the impedance control components to cause the combined load impedance to match the source impedance, while the load impedance fluctuates sharply, unpredictably, and sometimes chaotically. In the illustrative two-capacitor tuning system, for example, the matching network automatically adjusts the settings of the loading capacitor and the tuning capacitor to cause the combined load impedance to match the source impedance. More specifically, the tuning controller automatically computes desired matching network impedance values based on the measured load and/or combined load impedance. The tuning controller then computes a desired matching network impedance value required to drive the combined load impedance to match the source impedance. The tuning controller then determines the closest available (measured or imputed) matching network impedance value stored in the tuning database proximate to the desired matching network impedance. The tuning database then maps the closest available (measured or imputed) matching network impedance value to closest tuning values stored in the tuning database, and then utilizes the closest tuning values to tune the impedance control components to drive the matching network impedance proximate to the desired matching network impedance (i.e., drive the mismatch between the combined load impedance and the source impedance proximate to zero).

In general, the impedance of a tunable matching network responds in a relatively narrow and non-linear manner to changes in any particular impedance control component deployed in the network. Examples include changes in the capacitance of a single variable capacitor, changes in the inductance of a single variable inductor, changes in the resistance of a single varistor, and so forth. To increase the tuning range, a multi-dimensional matching network includes multiple impedance control components. For example, the matching network may include multiple tunable capacitors. In a representative embodiment, the matching network includes two tunable capacitors referred as the "loading capacitor" located closer to the RF generator (the source) primarily used to adjust the real portion of the matching network impedance, along with a "tuning capacitor" located closer to the plasma chamber (the load) primarily used to adjust the reactive portion of the matching network impedance. Together, the loading and tuning capacitors allow the impedance of the matching network to be adjusted throughout a two-dimensional tuning range (e.g., one dimension for each tunable capacitor) allowing fine adjustment of the impedance of the matching network throughout the tuning range.

When continually tuning the matching network during operation of the plasma generator, it is important to have an accurate mapping of the available two-dimensional tunable capacitor settings to actual impedance values of the matching network as a whole. In general, the impedance of a tunable matching network as a whole varies in a non-linear manner to variation of the impedance control components, such as the capacitance of any particular tunable capacitor. The nonlinearity compounds when multiple impedance control components are varied in tandem, such as a pair of tunable capacitors adjusted in tandem throughout a two-dimensional tuning range.

In addition, the settings of the impedance control components, such as the steps in the capacitance settings of various tuning capacitors, vary from each other to some extent due manufacturing tolerances. The impedance response of the matching network to two-dimensional capacitor tuning steps can therefore be difficult to model with sufficient accuracy for the desired accuracy and repeatability of the impedance match. Sufficiently accurate mapping of the available settings of the control components, such as tunable capacitor settings, to the actual impedance values of the matching network as a whole is therefore important to providing the desired level of match accuracy and repeatability.

To solve this problem, each plasma generation system is individually calibrated to map the available settings of the impedance control components (i.e., the tuning values) to actual measured and interpolated impedance values of the matching network. In the representative two-dimensional impedance matching network, for example, the plasma generation system is calibrated to map the available settings of the pair of tunable capacitors throughout the combined two-dimensional tuning combined range to the measured and interpolated tuning values of the matching network as a whole produced by the available tuning values.

To create a large tuning database from a more manageable set of measured calibration points, the tuning controller determines the tuning range, for example by scanning the matching network through the tuning ranges of the impedance control components, individually and in combination, to determine the contours of the tuning range. The tuning controller also defines a relatively small set of target impedance values spaced-apart throughout the tuning range. The tuning controller then iteratively drives the impedance control components through their available settings to identify a closest measured frame tuning value proximate to each target impedance value. The tuning controller then generates a much larger number of additional tuning values by computing interpolated tuning values between adjacent pairs of measured frame tuning values.

The tuning controller stores a tuning database containing a mapping of the available settings of the impedance control components to the actual measured and interpolated impedance values of the matching network as a whole produced by these tuning values. For this purpose, however, only a relatively small portion of the tuning values are measured frame tuning values, whereas most of the tuning values are computed by interpolating between the measured frame tuning values to finely cover the operational tuning range of the available impedance control components. The term "interpolation" refers to any suitable computational techniques used to impute values for tuning values between the measured frame tuning values, which may be visualized as a "frame" of measured calibration points utilized as tuning values for the impedance control components.

After the calibration stage, the tuning controller continually computes a desired matching network impedance value based on the measured load and/or combined load impedance value. The tuning controller then computes a closest matching network impedance value stored in the tuning database, which is mapped to a corresponding set of tuning values. The tuning controller then drives the impedance control components to their respective tuning values to continually drive the matching network impedance proximate to the desired matching network, which in turn drives the combined load impedance proximate to the source impedance, on an ongoing basis. In the two-dimensional matching network, for example, the tuning controller automatically adjusts the settings of the pair of tunable capacitors to cause the impedance of the matching network in combination with the plasma chamber (the combined load) to match the impedance of the RF generator (the source), which typically remains stable at 50 Ohms, on an ongoing basis.

As an optional feature, this technique may be augmented to match the impedance of the combined load with a variable source impedance. To enable this feature, a source impedance sensor provides the measured impedance of the RF generator source to the tuning controller, which adjusts the settings of the impedance control components to take into account changes in the impedance of the source RF generator on an ongoing basis.

As another optional feature, the matching network may also or alternatively include other impedance control components. For example, the inductor of the matching network may be a phase-shift variable inductor in series between the RF generator and the plasma generator enabling the matching network to vary the phase shift, and thus the impedance, between the source and the load. Conventionally, a fixed phase-shift inductor typically introduces a constant quarter-wave phase shift phase in the RF power delivered from the RF generator to the plasma chamber, while a single capacitor is used to finely adjust the matching network impedance.

In an alternative embodiment of the multi-dimensional matching network, a variable (adjustable-inductance) phase-shift inductor provides an adjustment range (e.g., zero to half-wave) in series between the RF generator and the plasma chamber. The variable phase-shift inductor increases the effective tuning range of the matching network to a three-dimensional tuning space. To enable this feature, the tuning controller utilizes a tuning database to map the available setting of the multiple impedance control components to actual measured fame impedance values and interpolated tuning values of the matching network as a whole produced by the available tuning values. In a three-dimensional example, the impedance control components include the variable phase-shift inductor, plus the variable load and tuning capacitors, which the tuning controller continually adjusts to match the impedance of the combined load impedance with the source impedance on an ongoing basis.

As another option, the matching network may additionally or alternatively include one or more shunt control legs between the RF generator and the plasma chamber. For example, a first shunt control leg may be electrically connected between the RF generator and the phase-shift inductor, and a second shunt control leg may be electrically connected between the phase-shift inductor and the plasma chamber. Each shunt control leg may include a variety of impedance control components including one or more switching elements, resistive elements, and reactive elements. In a representative embodiment, each shunt control leg includes a series connection of one switch, two DC-blocking capacitors, and one power resistor primarily used as a power dissipator to help control arcing, sputtering and other plasma process phenomena occurring in the plasma chamber. This type of shunt control leg typically operates at least an order of magnitude faster than the motorized impedance control components, such as conventional variable capacitors.

As another option, the shunt control legs may include one or more tunable electronic elements that operate on a faster, similar, or slower time scale in comparison to the other tunable elements of the matching network, which also meaningfully impact the impedance of the matching network. These additional impedance control components may be calibrated, incorporated into the tuning database, and utilized to tune the impedance of the matching network, in addition to power dissipation within the matching network, on an ongoing basis. Examples may include variable resistors (varistors), variable inductors, variable capacitors, and so forth.

Figure 11:
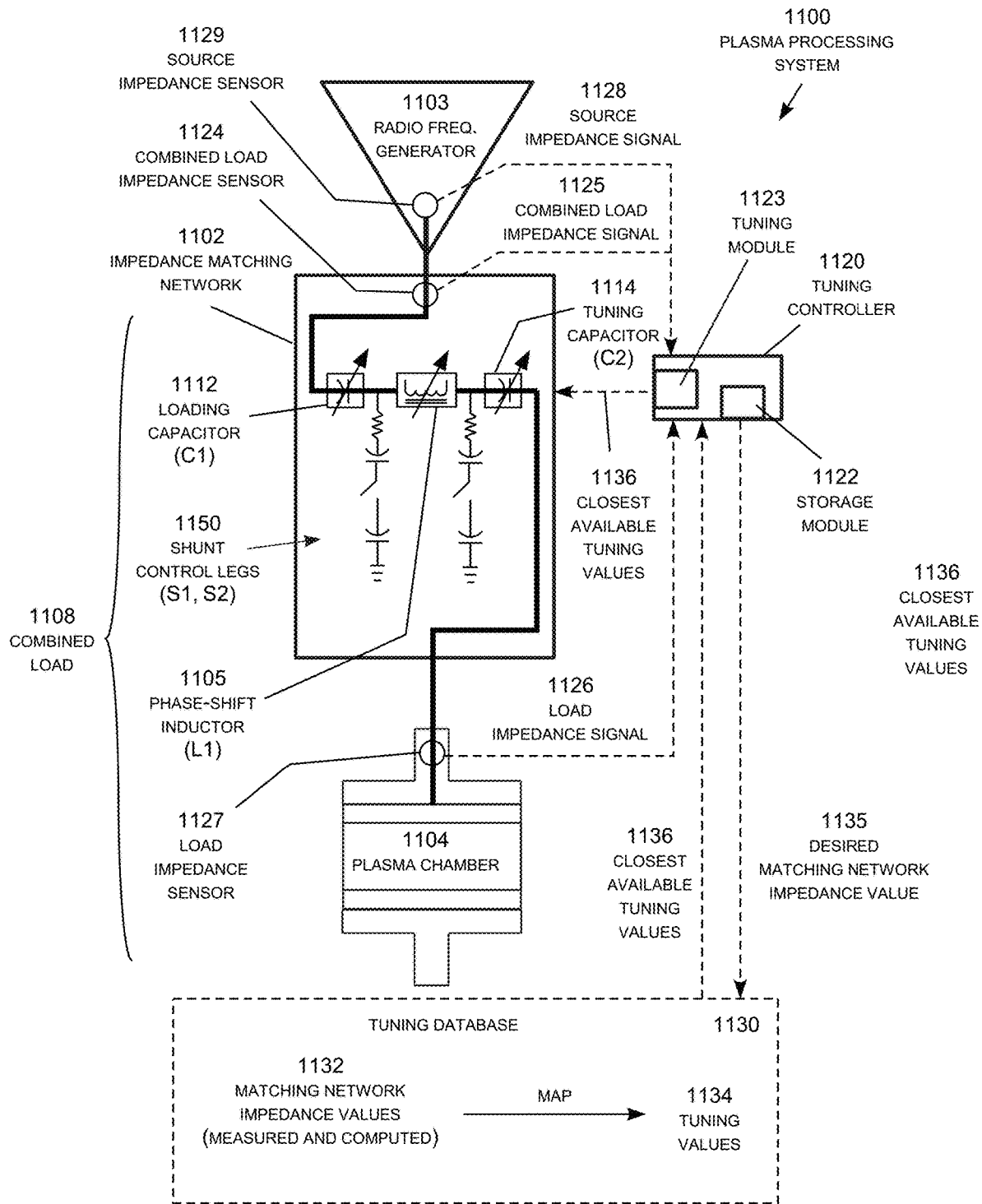
FIG. 11 is a schematic representation of a plasma generation system with a two-dimensional impedance matching network.

FIG. 11 is a schematic representation of a plasma generation system 1100 with a two-dimensional impedance matching network 1102 located between a radio frequency (RF) generator 1003 (the "source") and a plasma chamber 1104 (the "load"). The matching network 1102 automatically adjusts its impedance to cause the impedance of the matching network together with the plasma chamber 1104 (the combined load 1108) to match the source impedance of the RF generator 1003, which is typically stable at 50 Ohms, on an ongoing basis.

In brief summary, the RF generator 1103 generates high frequency RF power, for example in the frequency range of 400 KHZ to 400 MHZ, voltage range of 10 to 100 KV, amperage range of 100 A to 10 KA, and power range of 100 KW to 1 MW to drive the plasma chamber 1104 to generate plasma streams for a variety of plasma manufacturing operations taking place inside the plasma chamber. The RF power may be used, for example, to illuminate one or more concentric coil antennas that ionize a process gas entering the plasma chamber to create a plasma stream directed toward a workpiece, such as masked semiconductor wafer used to manufacture an integrated circuit chip.

The plasma stream may be directed across a filament, screen, or leaf containing a sacrificial metal, such as gold or other desired material, to be deposited onto the wafer. The plasma causes the sacrificial metal to shed ionized atoms or molecules, which are directed by the magnetic field generated by the plasma chamber onto the workpiece. In other plasma processing operations, the plasma may be used to etch, coat, clean, or perform other manufacturing operations on the workpiece. The plasma operations can cause arcing, sputtering, and other rapidly changing plasma phenomena causing the impedance of the plasma chamber to vary sharply in unpredictable and sometimes chaotic manners. The tuning controller continually adjusts the impedance of the matching network in response to these changes in the load impedance to maintain the match between the combined load impedance and the source impedance of the RF generator.

In an RF power system in general, any mismatch between the source impedance and the load impedance causes a reflection of the power directed to the load, reducing the efficiency of the power delivery and potentially damaging the RF generator or other components in the RF generator, the matching network, other components in the RF power system. Maintaining a close match between the combined load and the source RF generator is therefore desirable in commercial plasma generating systems, which are expected to perform extremely precise and repeatable plasma manufacturing operations at micron scales over long operating lives.

To match the impedance of the combined load 1108 with the impedance of the source RF generator 1103, the matching network 1102 includes a phase-shift inductor 1105 electrically connected in series between the RF generator 1103 and the plasma chamber 1104. In conventional plasma generation systems, the inductor 1105 typically injects a fixed quarter-wave phase shift in the RF power as it propagates from the source to the load to partially match the combined load impedance with the source impedance. To allow continual fine adjustment of the match impedance, the matching network 1102 includes one or more adjustable tunable capacitors electrically connected in series between the RF generator 1103 and the plasma chamber 1104.

In a two-dimensional example of the innovative multi-dimensional matching network, the tunable capacitors include a loading capacitor 1112 (designated C1) electrically connected in series between the RF generator 1103 and the phase-shift inductor 1105, along with a tuning capacitor 1114 (designated C2) electrically connected in series between the phase-shift inductor 1105 and the plasma chamber 1104. The loading capacitor 1112, which is located closer to the source, is primarily used to adjust the real component of the match impedance, while the tuning capacitor 1114, which is located closer to the load, is primarily used to adjust the reactive component of the match impedance.

To continually tune the match, the matching network 1102 includes or is coupled to a tuning controller 1120, which includes a computer storage module 1122 and a tuning module 1123 in addition to other necessary or convenient controller components. The matching network 1102 also includes a combined load impedance sensor 1124, which provides a combined load impedance signal 1125 to the tuning controller 1120 used to continually adjust the settings of the tunable capacitors, in this example the loading capacitor 1112 and the tuning capacitor 1114. The tuning controller 1120 may additionally or alternatively receive a load impedance signal 1126 from a load impedance sensor 1127 located in or coupled to the plasma generator 1004. Similarly, the tuning controller 1120 may additionally receive a source impedance signal 1128 from a source impedance sensor 1129 located in or coupled to the RF generator 1003. Individually or in combination, these impedance signals provide the matching network with continuous monitoring of the impedance of the combined load 1108 to be matched with the impedance of the RF generator source 1103, by the matching network 1102, on an ongoing basis.

The storage module 1222 of the tuning controller 1120 includes a tuning database 1130 storing a mapping of measured and computed matching network impedance for the matching network as a whole to the available settings 1134 (tuning values) for the impedance control components, in this example the tunable capacitors. The tuning controller 1120 computes the desired matching network impedance value 1135 to drive the difference between the combined load impedance and the source impedance to zero. The tuning controller 1120 uses the desired matching network impedance value 1135 to look up the closest available tuning values 1136 for the tunable capacitors in the tuning database 1130, which the tuning controller uses to tune the matching network 1102 to drive the impedance of matching network impedance proximate to the desired matching network impedance value 1135.

As an optional feature for a system with a variable impedance source 1103, the technique described above can be modified to match the impedance of the combined load 1108 with the impedance of the variable source. To enable this feature, the source impedance sensor 1129 provides a source impedance signal 1128 indicating the measured impedance of the RF generator 1103 to the tuning controller 1120, which takes changes in the impedance of the source RF generator into account when computing the desired matching network impedance value 1135 on an ongoing basis.

As another optional feature, the phase-shift inductor 1105 may be an adjustable inductor in series between the RF generator 1103 and the plasma chamber 1104 enabling the matching network 1102 to vary the phase shift, and thus the impedance, between the source and the load. Typically, a fixed series inductor introduces a quarter-wave phase shift phase in the RF power flowing from the RF generator to the plasma generator. Utilizing an adjustable phase-shift inductor 1105 provides an additional tuning range (e.g., zero to half-wave) increasing the effective tuning range of the tuning controller 1120 to a three-dimensional tuning space. To enable this feature, the tuning controller 1120 utilizes a three-dimensional tuning database 1130 mapping the measured frame and interpolated matching network impedance values 1132 to available settings for three impedance control components, in this example the variable phase-shift inductor 1105, the loading capacitor 1112, and the tuning capacitor 1114.

As another option, the matching network 1102 may also or alternatively include one or more shunt control legs 1150 between the RF generator 1103 and the plasma chamber 1104. For example, the representative embodiment shown in FIG. 11 includes a first shunt control leg electrically connected between the RF generator 1103 and the phase-shift inductor 1105, along with a second shunt control leg electrically connected between the phase-shift inductor 1105 and the plasma chamber 1104. In the illustrated example, each shunt control leg includes a switch, a pair of DC-blocking capacitors, and a resistor primarily used as a power dissipator to control arcing, sputtering, and other undesired plasma phenomena in the plasma chamber. In addition to dissipating power, switching the shunt control legs 1150 changes the impedance of the matching network 1102, which the tuning controller 1120 may take into account when computing the match impedance. Alternatively or additionally, the shunt control leg may include one or more tunable elements that also impact the impedance of the matching network, such as variable capacitors, variable inductors, variable resistors (varistors), and the like. These additional impedance control components may be calibrated, incorporated into the tuning database, and utilized to tune the impedance of the matching network to provide additional control over the match impedance, along with power dissipation by the matching network 1102, on an ongoing basis.

Regardless of the types of impedance control components, the number of impedance control components, the resolution of the impedance control components, or the details of the interpolation algorithms, the tuning controller 1120 utilizes the calibrated closest available tuning values 1136 returned by the tuning database 1130 to drive the impedance control components to the closest available settings to drive the impedance of the matching network 1102 proximate to the desired matching network impedance value 1135. From this disclosure, those skilled in the art will be enabled to construct additional embodiments with different types of impedance control components, different numbers of impedance control components, different resolutions of the impedance control components, different types of interpolation algorithms, and other design choices without undue experimentation.

Figure 12:
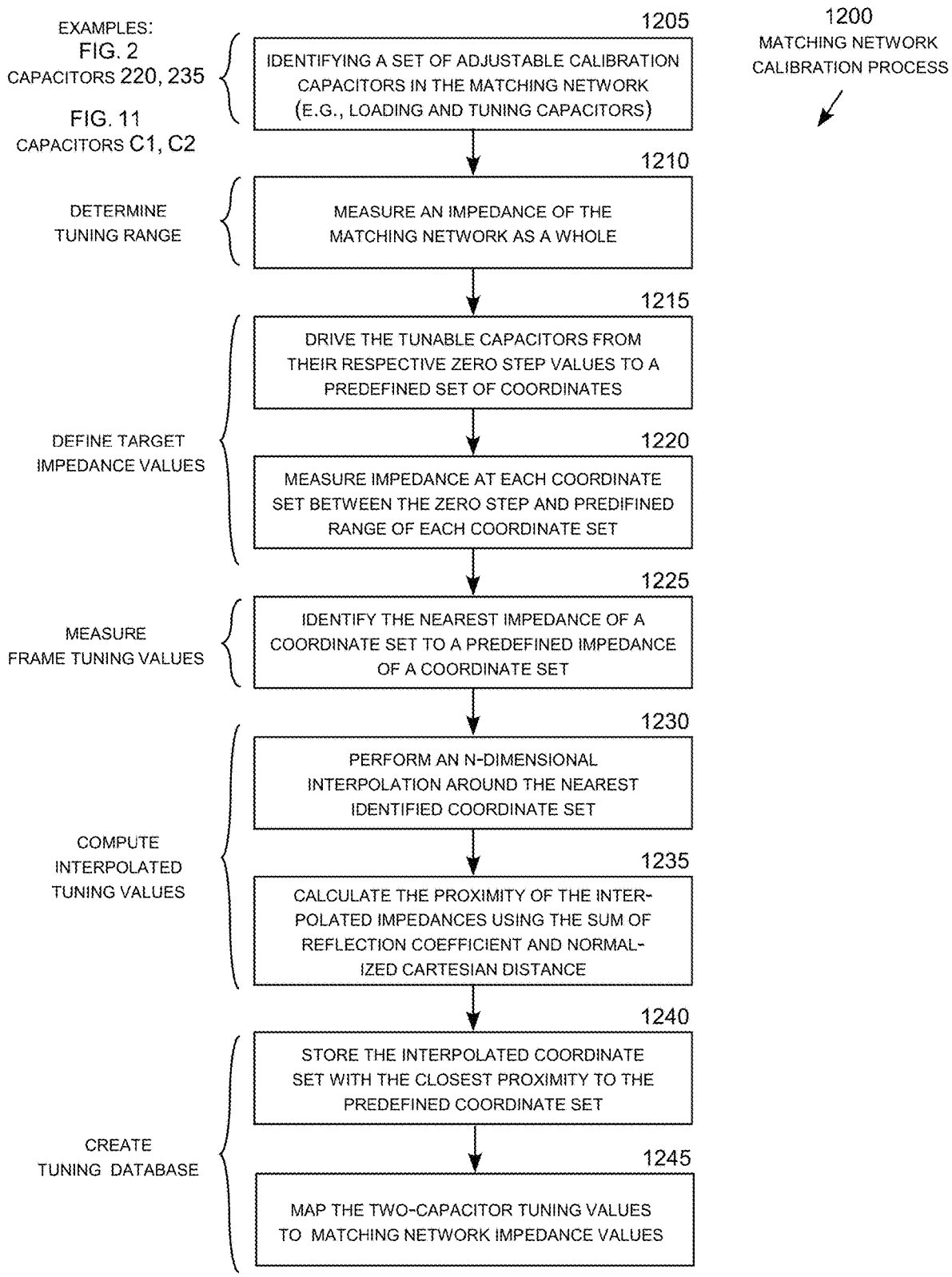
FIG. 12 is a logic flow diagram for the two-dimensional matching network calibration process.
Figure 15:
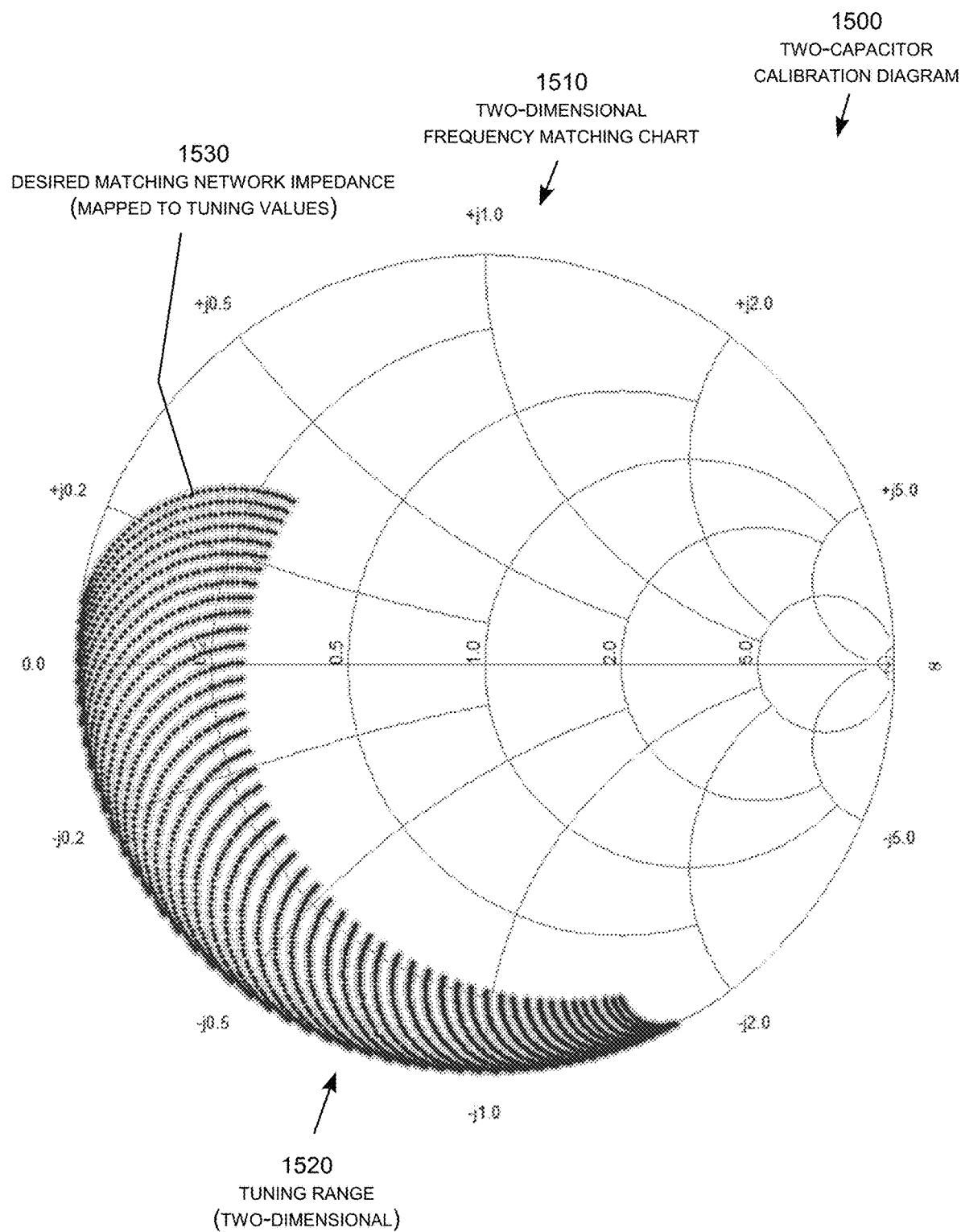
FIG. 15 is a two-capacitor matching network calibration diagram.
Figure 16:
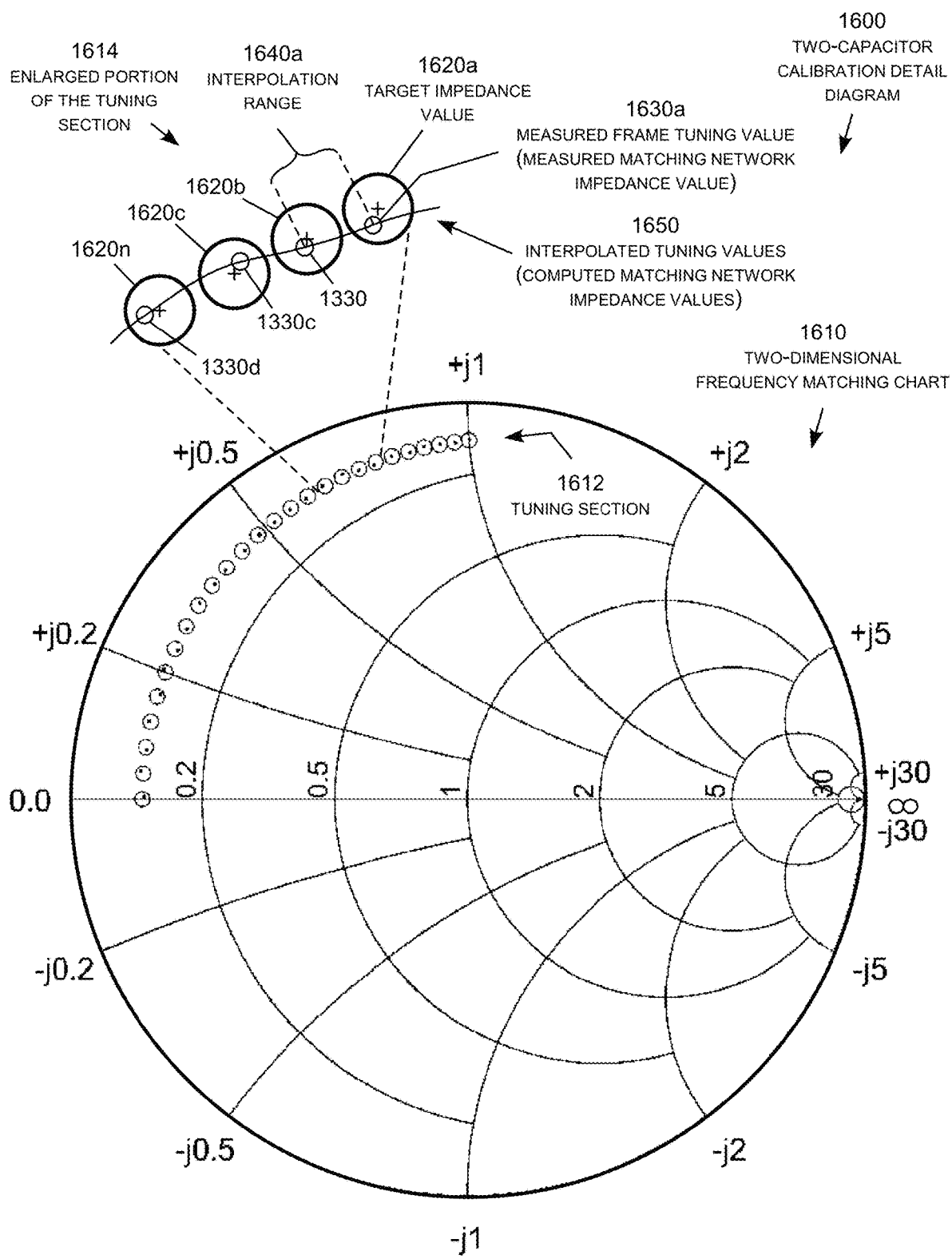
FIG. 16 is a two-capacitor matching network calibration detail diagram.
Figure 17:
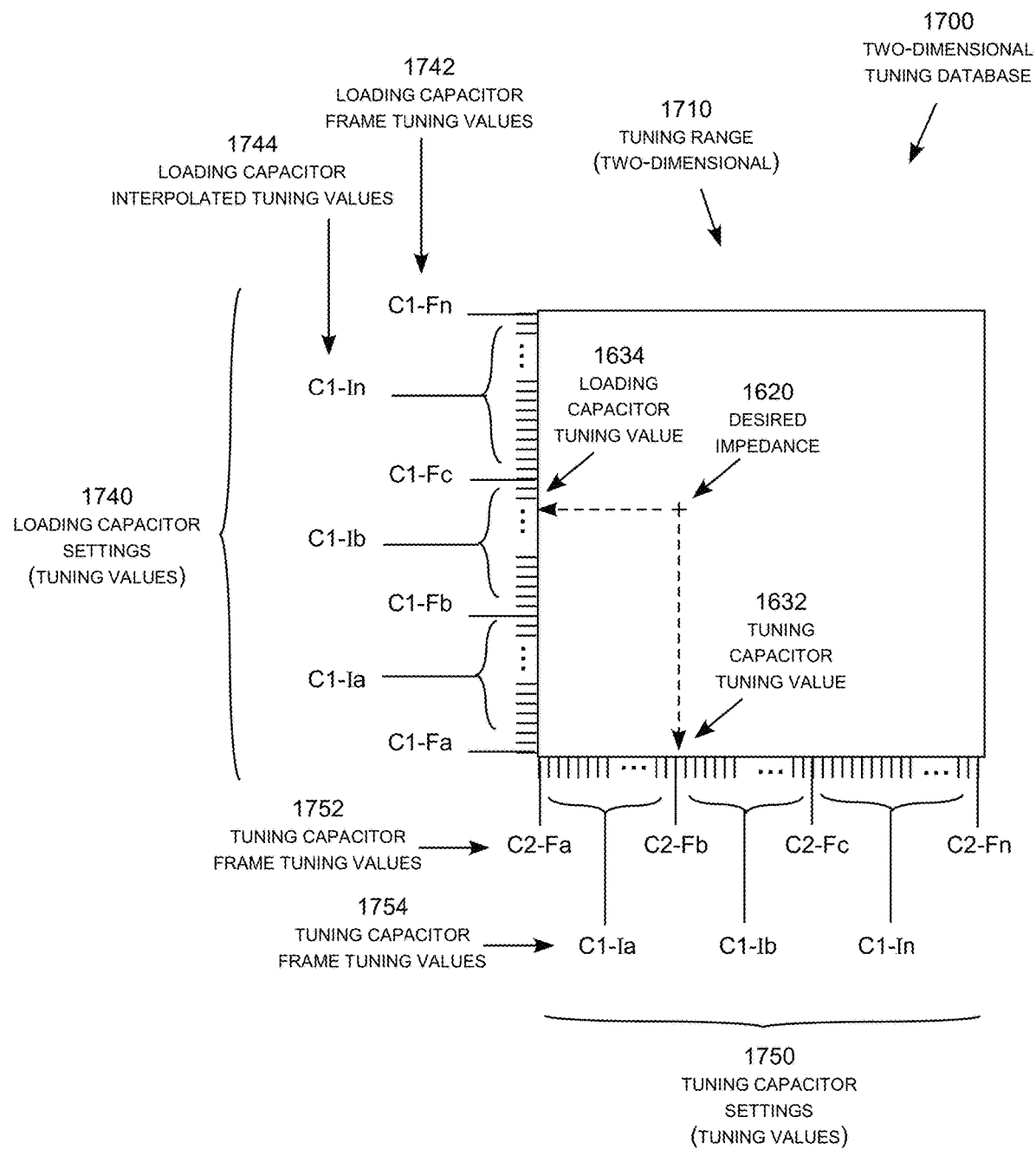
FIG. 17 is a conceptual illustration of a two-dimensional matching network tuning database.

Referring again to the two-dimensional tuning example, FIG. 12 is a logic flow diagram for a two-dimensional matching network calibration process 1200. FIG. 15 is a two-capacitor matching network calibration diagram 1500, FIG. 16 is a two-capacitor matching network calibration detail diagram 1600, and FIG. 17 is a conceptual illustration of a two-dimensional tuning database 1700, which will be described together with FIG. 12 to assist in the description of the illustrate process. Step 1205 includes identifying a set of adjustable impedance control components, which is typically performed by a system designer prior to calibrating the matching network 1102. FIG. 2 shows a first example including two impedance control components, the loading capacitor 220 and the tuning capacitor 235. FIG. 11 shows a second example including the tunable capacitors, including the loading capacitor 1112 and the tuning capacitor 1114.

Step 1205 is followed by step 1210, in which the tuning controller measures the impedance of the matching network as a whole for combinations and permutations of the available settings of the tunable capacitors. This typically involves scanning the impedance control components through their respective tuning ranges, individually and in tandem with each other, to determine the contours of the tuning range reachable by the tunable capacitors. In this example, the tuning range is two-dimensional including one dimension for each tunable capacitor. FIG. 15 shows a two-dimensional frequency matching chart 1510 (sometimes referred to as a "Smith chart" used to visualize impedance matching networks) showing a typical two-dimensional tuning range 1520. Step 1205 identifies the tuning range 1520, with the ensuing steps filling the mapping of the available tunable capacitor settings to actual measured frame and interpolated values of the impedance of the matching network as a whole. Referring to FIG. 11, a pair of settings for the loading capacitor 1112 and the tuning capacitor 1114 produce the closest available impedance for the matching network to drive the impedance of the matching network proximate to the desired matching network impedance value. This can be visualized in FIG. 15 as a specific pair of tuning values mapped to a specific point 1530 representing a corresponding the proximate matching network impedance value within the available tuning range 1520 and, therefore, reachable by the matching network by setting the impedance control components to the associated tuning values.

Step 1210 is followed by step 1215, in which the tuning controller defines target impedance values. In this example, the tuning controller drives the tunable capacitors from their respective zero step values to a predefined set of coordinates; and step 1215 is followed by step 1220, in which the tuning controller measures the impedance of the matching network at each coordinate set between the zero step values to a predefined set of coordinates. This defines a number of target impedance values spaced apart throughout the two-dimensional tuning range. Additionally or alternatively, one or more of the target impedance values may be determined mathematically once the contours of the tuning range have been determined.

FIG. 16 shows a two-dimensional frequency matching chart 1610 showing a conceptual tuning section 1612 including an enlarged portion 1614 to help visualize the procedure. FIG. 16 shows a number of target impedance values 1620a-1620d within the tunable range of the matching network. To provide a specific example, an interpolation range 1640a extends between two adjacent measured fame tuning values 1620a and 1620b. The calibration controller computes additional tuning values for the interpolation range 1640a between the two measured tuning values. The number of available settings of each impedance control component is a fixed physical property of the particular component, while the tuning controller 1120 includes a relatively larger number of interpolated tuning values, in addition to the much smaller number of the measured frame tuning values, to provide greater apparent resolution of the tuning database. The greater apparent resolution of the available matching network impedance values 1132 stored in the tuning database 1130 assists in quickly identifying the closest available matching network impedance in the tuning database 1130 corresponding to a particular desired matching network impedance value 1135 during plasma system operation.

The number of interpolated tuning values may be at least 1,000 larger than the number of measured frame points. For example, a two-dimensional tuning database containing on the order of 100 interpolated tuning values for each measured frame tuning value in each of two dimensions has on the order of 10,000 interpolated calibration points for every measured frame calibration point. Similarly, a three-dimensional tuning database containing on the order of 100 computed tuning values for each measured frame value in each of three dimensions has on the order of one million interpolated tuning points for every measured frame calibration point. The number of available settings of the tunable capacitors (the real resolution), the number of available matching network impedance values reflected in the tuning database for the data lookup (the apparent resolution), and the accuracy of the mapping of the tunable capacitor tuning values to the desired matching network impedance values (the calibration) are important factors in maintaining the desired accuracy and repeatability of the operation of the matching network 1102.

Note that although the tuning section 1612 does not fall within the tuning range 1520 shown on FIG. 15, FIG. 16 nevertheless provides a conceptual mechanism to help visualize the calibration process. In an actual plasma processing system, the tuning sections would fall within the tuning range of the matching network.

Returning now to FIG. 12, step 1220 is followed by step 1225, in which the tuning controller identifies the nearest impedance of a coordinate set to a predefined impedance of a coordinate set. For each target impedance value, the tuning controller drives the tunable capacitors to generate a measured frame value in which each frame value includes a two-capacitor tuning value pair producing the closest matching network impedance value proximate to an associated target impedance value. Referring to FIG. 16, the measured frame tuning values 1630*a*-1630*n* are visualize this process, in which each measured frame tuning value corresponds to a respective target impedance value 1620*a*-1620*n*. As a result, setting the loading capacitor 1112 and the tuning capacitor 1114 to a first set of tuning values drives the matching network as a whole to the first measured frame tuning value 1630*a*, which is the closest matching network impedance value proximate to the first target impedance value 1620*a* obtainable with the available tunable capacitor settings. Similarly, setting the loading capacitor 1112 and the tuning capacitor 1114 to a second set of tuning values drives the matching network as a whole to the second measured frame tuning value 1630*a*, which is the closest matching network impedance value proximate to the second target impedance value 1620*a*, and so forth.

Step 1225 is followed by step 1230, in which the tuning controller 1120 performs an n-dimensional interpolation around the nearest identified coordinate set. Step 1230 is followed by step 1235, in which the tuning controller calculates the proximity of the interpolated impedances using the sum of reflection coefficient and normalized cartesian distance. Referring to FIG. 16, this process is visualized by the interpolated calibration tuning value curve 1650. The frame tuning values 1630*a*-1630*d* represent a relatively small number of measured matching network frame tuning values spaced apart throughout the tuning range, while steps 1225-1235 effectively fill in the tuning range by computing a much a larger number of interpolated tuning values represented by the curve 1650. Although the interpolated calibration tuning value curve 1650 is a continuous line segment, those skilled in the art will appreciate the number of interpolated tuning values is limited as a practical matter to a discrete number of computed values.

Step 1235 is followed by step 1240, in which the tuning controller stores the interpolated coordinate set with the closest proximity to the predefined coordinate set. Step 1240 is followed by step 1245, in which the tuning controller maps the available two-capacitor tuning values reachable with the available settings of the loading capacitor 1112 and the tuning capacitor 1114 to measured and interpolated matching network impedance values. Referring to the example shown in FIG. 11, this produces the tuning database 1130 used by the tuning controller 1120 during operation of the plasma generation system 1100 to maintain the match between the impedance of the matching network 1102 in combination with the plasma generator (the combined load) and the impedance of the RF generator 1103 (the source).

FIG. 17 is a conceptual illustration of a two-dimensional tuning database 1700 illustrating a two-dimensional tuning range 1710, which includes one dimension for the loading capacitor 1112 referred to as "C1" and a second dimension for the tuning capacitor 1114 is referred to as "C2." The capacitance C1 of the loading capacitor 1112 is plotted on the vertical axis in which the measured loading capacitor frame tuning values 1742 are indicated as C1-Fa through C1-Fn, while the more numerous interpolated loading capacitor tuning values 1744 are indicated as C1-Ia through C1-In. Together, the measured loading capacitor frame tuning values 1742 and the interpolated loading capacitor tuning values 1744 are stored as the loading capacitor tuning values 1740. Similarly, the capacitance C2 of the tuning capacitor 1114 is plotted on the horizontal axis in which the measured tuning capacitor frame tuning values 1752 are indicated as C2-Fa through C2-Fn, while the more numerous interpolated tuning capacitor tuning values 1754 are indicated as C2-Ia through C2-In. Together, the measured tuning capacitor frame tuning values 1742 and the interpolated tuning capacitor tuning values 1744 are stored as the tuning capacitor tuning values 1750.

The measured and interpolated tuning values fill the tuning database 1700, allowing each matching network impedance value represented tuning database to be quickly mapped to its closest pair of tuning values available to drive the impedance of the matching network proximate to the desired impedance value. Referring to FIG. 11, calibrating the tuning database 1700 prior to operating the plasma processing system 1100 allows the matching network 1102 to be continually tuned on an ongoing without interpolation or other complex computations during operation of the matching network. This allows the matching network to respond very quickly, efficiently, and accurately with highly repeatable performance when maintaining the impedance match in response to sharp, unpredictable, and sometimes chaotic fluctuations in the load impedance of the plasma chamber due to plasma arcing, sputtering, and other plasma process phenomena.

Figure 18:
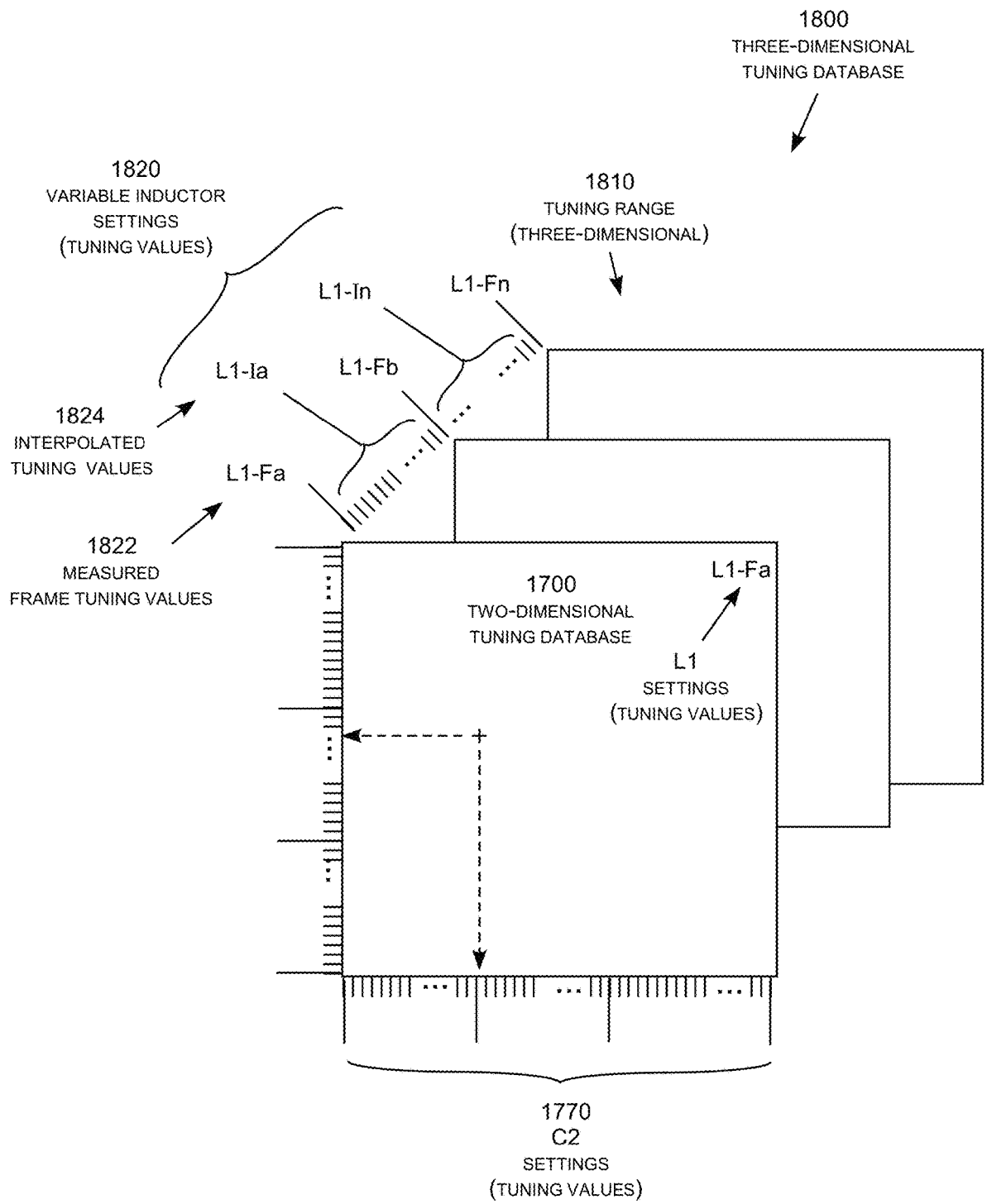
FIG. 18 is a conceptual illustration of a three-dimensional matching network tuning database.

FIG. 18 is a conceptual illustration of a three-dimensional tuning database 1800 illustrating a three-dimensional tuning range 1810. The variable inductor tuning values 1820 indicated as "L1" have been added as another dimension to the two-dimensional tuning values 1700 shown in FIG. 7. The inductance L1 of the variable inductor 1105 is plotted on the third Cartesian axis "into the page" in which the measured frame tuning values 1822 for the variable inductor 1105 are indicated as L1-Fa through L1-Fn, while the more numerous interpolated variable impedance values 1824 for the variable inductor are indicated as L1-Ia through L1-In. Together, the measured frame tuning values 1822 and the interpolated tuning values 1824 are stored as the variable inductor tuning values 1820.

Figure 13:
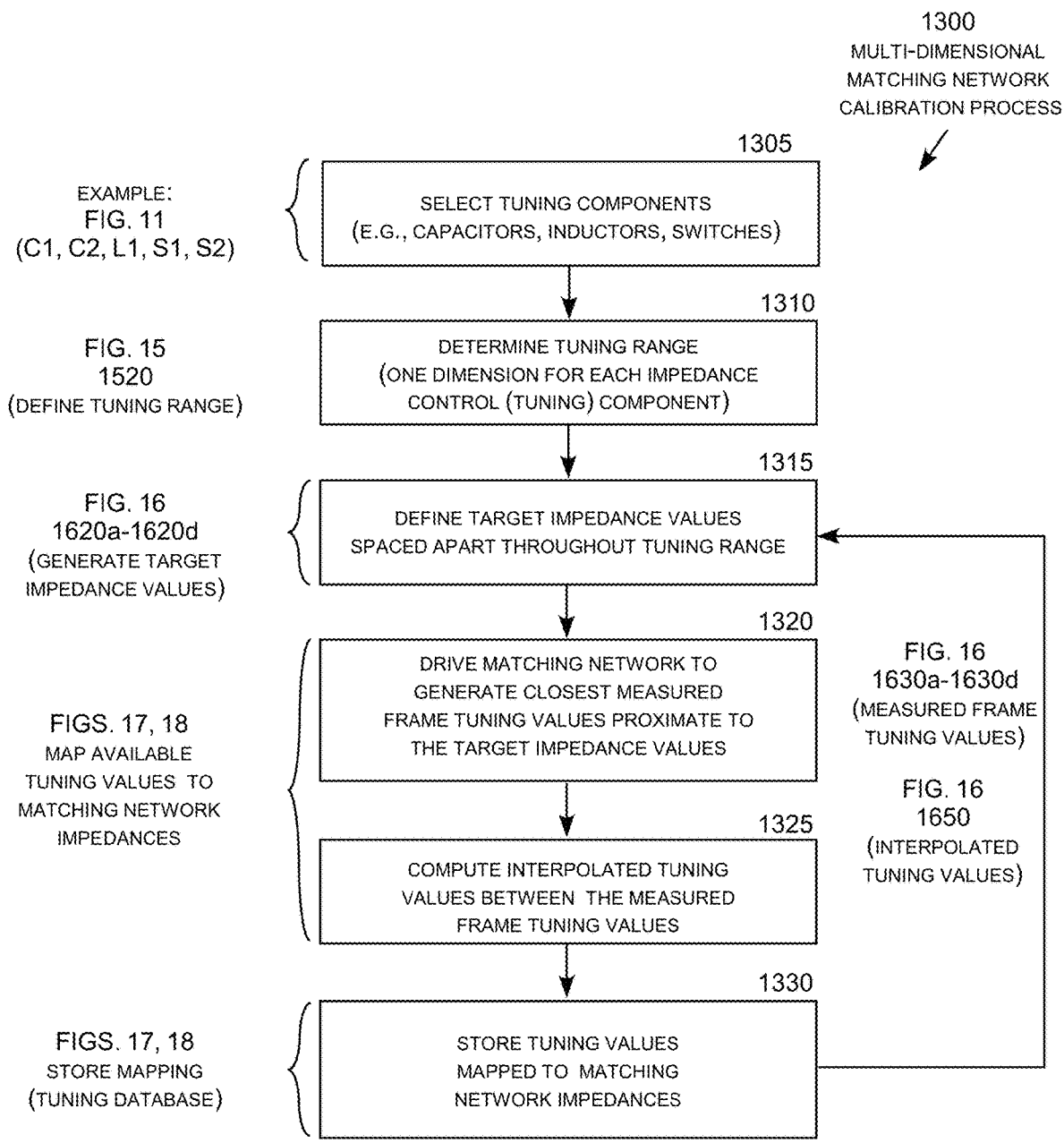
FIG. 13 is a logic flow diagram for a multi-dimensional matching network calibration process.

Referring again to FIG. 11, the matching network 1200 may include other impedance control components represented by the variable phase-shift inductor 1105 and the shunt control legs 1150, which may be operated in additional to, or as alternatives to, one or more tunable capacitors. To generalize the process shown in FIG. 12, FIG. 13 is a logic flow diagram for a multi-dimensional matching network calibration process 1300. In step 1305, a number of impedance control components are selected, such as the variable loading capacitor 1112 (C1), variable tuning capacitor 1114 (C2), the variable phase-shift inductor 1105 (L1), and the shunt control legs 1150 (S1 and S2) shown in FIG. 11. This step is typically performed by a system designer prior to calibration of the system. These specific impedance control components are merely illustrative, as those skilled in the art will be enabled to modify and expand embodiment of the invention based on the specific examples illustrated and described in this disclosure. For example, additional switches, varistors, variable shunt inductors, variable shunt capacitors, and other impedance control components may be included as a matter of design choice.

Step 1305 is followed by step 1310, in which the tuning controller drives the matching network to determines a tuning range for the matching network, typically by measuring the impedance of the matching network for combinations and permutations of the available settings of the impedance control components. This typically involves scanning the impedance control components through their respective tuning ranges, individually and in tandem with each other, to establish the tuning range. This process is illustrated in FIG. 15 for the two-dimensional tuning range 1520. A three-dimensional tuning range can be visualized as multiple instances of two-dimensional tuning ranges extending "into the page" through a third dimension of Cartesian space. Mathematical constructs can be defined for higher dimensional tuning databases.

To create a large tuning database from a more manageable set of measured calibration points, step 1310 is followed by step 1315, in which the tuning controller defines a relatively small set of target impedance values spaced-apart throughout the tuning range. This may involve driving the matching network to measure specific target impedance values, computing target impedance values, or a combination of measuring and computing target impedance values. This process is illustrated by the target impedance values 1620a-1620d shown in FIG. 16 for a two-dimensional tuning range. Additionally or alternatively, one or more of the target impedance values may be determined mathematically once the contours of the tuning range have been determined.

A calibration frame is constructed by iteratively adjusting the settings of the impedance control components to identify the closest available settings of the impedance control components corresponding to each target impedance value, in view of the limited number of available settings (tuning values) of the impedance control components. In the two-capacitor example, the tuning controller iteratively adjusts the settings of the tunable capacitors to identify the closest two-capacitor tuning values (i.e., settings of the tunable capacitors) corresponding to each target impedance value.

To provide the desired accuracy and repeatability in matching performance, the tuning databases 1132 is calibrated to map the measured and computed matching network impedance values 1132 to the closest available specific settings of the tunable capacitors (i.e., the tuning values) throughout the two-dimensional tuning range of the tunable capacitors. Step 1315 is followed by step 1320, in which the tuning controller drives the matching network to generate closest frame tuning values proximate to each target impedance value. This process is illustrated by the measured frame tuning values 1630a-1630d proximate to their respective target impedance values 1620a-1620d shown in FIG. 16 for a two-dimensional tuning range.

A tuning database with a much larger number of calibrated tuning values, for example on the order of at least 1000 times larger than the measured frame tuning values, may be created by computing interpolated tuning values between adjacent pairs of the measured frame tuning points. Step 1320 is followed by step 1325, in which the tuning controller computes the interpolated tuning values between adjacent measured frame tuning values. Together, steps 1325 and 1330 create the available tuning values for the impedance control components throughout the tuning range. This process is illustrated by the interpolated tuning curve 1650 shown in FIG. 15 for a two-dimensional tuning range. Although the interpolated tuning values are represented by a continuous line segment, the number of interpolated tuning values are limited as a practical matter to a discrete number of interpolated values.

The tuning controller creates the tuning database, which maps measured and computed matching network impedance values to corresponding impedance control component settings, in view of available settings of the impedance control components. Step 1330 is followed by step 1335, in which the tuning controller creates and stores the tuning database, which is represented by the tuning database 1130 shown in FIG. 11. A conceptual illustration of a two-dimensional tuning database 1700 is shown in FIG. 17, which is expanded to the three-dimensional tuning database 1800 shown in FIG. 18 for the representative three-dimensional embodiment. The three-dimensional tuning database 1800 includes a third dimension extending "into the page" representing adjustment of the variable phase-shift inductor 1105 shown in FIG. 11. Mathematical constructs can be defined for higher dimensional tuning value databases to incorporate continual adjustment of additional impedance control components, represented by but not limited to the shunt control legs 1150 shown in FIG. 11.

After the calibration stage, the tuning controller uses the tuning database to map desired matching network impedance values to closest available impedance control component tuning values, which are then used to adjust the settings of the impedance control components on an ongoing basis. Referring to FIG. 11, the tuning controller 1120 automatically adjusts the settings of the loading capacitor 1121 (C1), the tuning capacitor 1114 (C2), and the variable phase-shift inductor 1105 (L1) to adjust the impedance of the matching network to the closest available impedance values proximate the desired matching network impedance values. This drives the impedance of the combined load 1108 to the closest available match, in view of the limited number of available settings of the impedance control components (C1, C2, and L1), to drive the combined load impedance to the closest available match with the source impedance of the RF generator 1103, which is typically stable at 50 Ohms. As noted previously, if the impedance of the RF generator varies, the tuning controller 1120 uses the source impedance signal 1128 to account for this variation in the source impedance.

Figure 14:
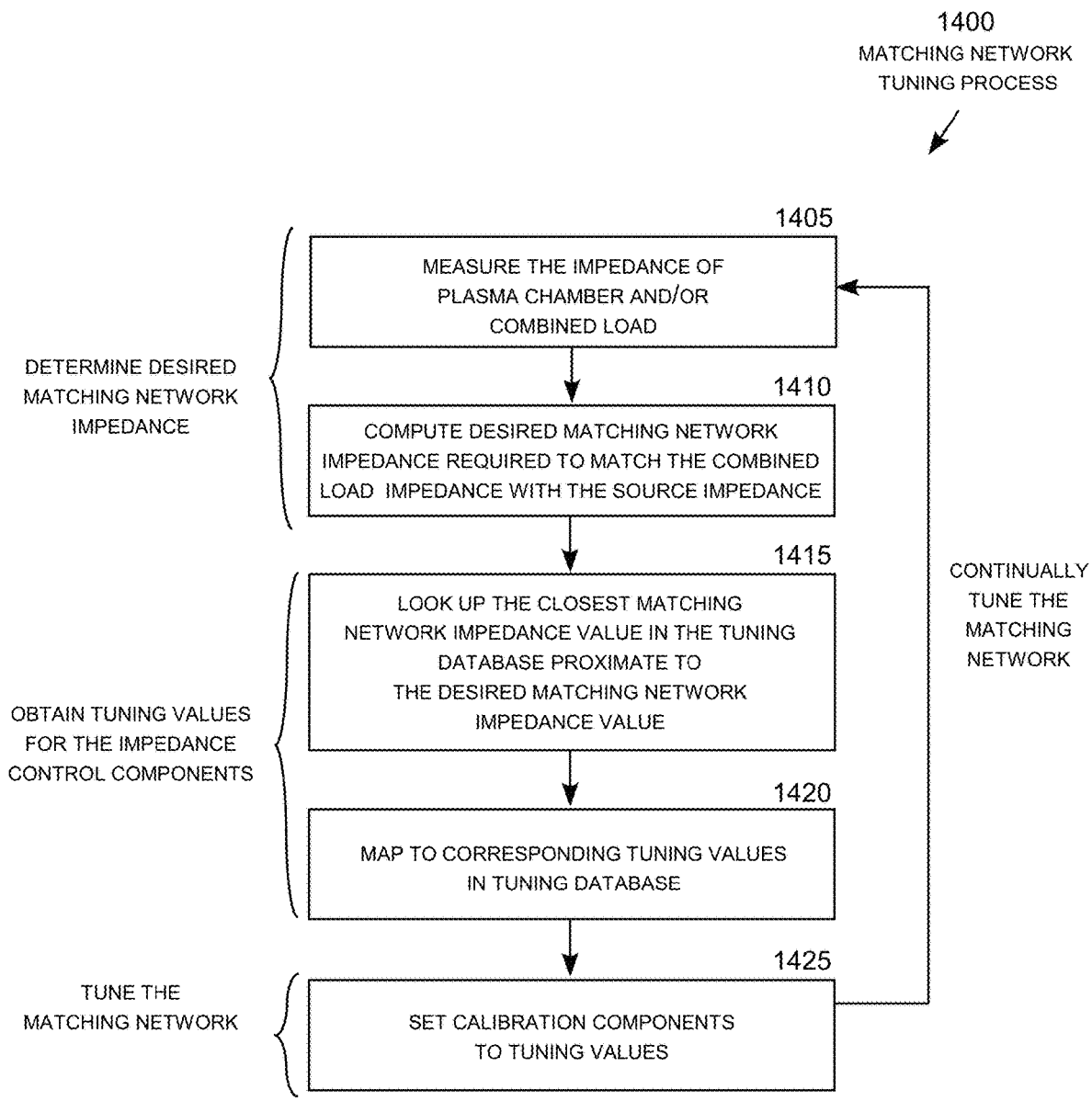
FIG. 14 is a logic flow diagram for a matching tuning process.

FIG. 14 is a logic flow diagram for a multi-dimensional matching network operating process 1400, which is implemented after the calibration process shown in FIG. 13 to manufacture products, such as silicon semiconductor wafers for integrated circuit chips, after the plasma processing system 1000 has been calibrated. In step 1405, the plasma controller measures the impedance of the plasma chamber and/or the combined load. Step 1405 is followed by step 1410, in which the plasma controller uses the measured impedance of the plasma chamber and/or the combined load to compute the desired matching network impedance required to match the combined load impedance with the source impedance. Together, steps 1405 and 1410 determine the desired matching network impedance value 1135 shown in FIG. 11.

Step 1410 is followed by step 1415, in which the plasma controller identifies the closest matching network impedance stored the tuning database proximate to the desired matching network impedance, and then looks up the closest matching network impedance value in the tuning database proximate to the desired matching network impedance value. Step 1415 is followed by step 1420, in which the plasma controller uses the closest matching network impedance values stored in the tuning databases to look up the corresponding closest tuning values stored in tuning database. Together, steps 1415 and 1420 obtain the closest available tuning values 1136 for driving the impedance of the matching network proximate to the desired matching network impedance value 1135, as shown ins FIGS. 11 and 16.

Step 1420 is followed by step 1425, in which the tuning controller sets the calibration components to the closest available tuning values 1136, which drives the impedance control components to tune the matching network 1102 to the closest available impedance proximate to the desired matching network impedance value 1135, as shown ins FIGS. 11 and 16. Referring to FIG. 11, the impedance control components include the loading capacitor 1112 and the tuning capacitor 1114 for the two-dimensional embodiment. Similarly, the impedance control components include the variable phase-shift inductor 1105 in addition to the loading capacitor 1112 and the tuning capacitor 1114 the three-dimensional embodiment. The matching network process 1400 is repeated continually to match the source impedance with the combined load impedance on an ongoing basis. In addition, the multi-dimensional matching network calibration process 1300 may be repeated on an as-needed basis to re-calibrate the matching network, for example to account for performance drift or replacement one or more of the impedance control components.

One of ordinary skill in the art will recognize that each computing device described in this disclosure may be a cloud-based server, a network server, a workstation, a desktop, a laptop, a netbook, a tablet, a smartphone, a mobile device, and/or any other type of computing device in accordance with one or more example embodiments. Nevertheless, it will be understood that the tuning controller 1120 shown in FIG. 11 is an extremely high speed, special purpose industrial controller suitable for calibrating and operating the matching network 1102. Accordingly, the tuning controller 1120 may not require all of the user I/O devices, network controllers, cloud interfaces, and other components typically found in general-purpose computers. The tuning controller 1120 may therefore be any type of suitable dedicated, special purpose industrial computer. Examples include an application-specific integrated circuit (ASIC), a field-programable gate array (FPGA), a neural network processor, a quantum computing processor, a microcontroller, or any other appropriately configured controller for this particular purpose. All such devices include a processor and computer-readable memory storing non-transitory computer instructions that, when executed by the processor, causes the processor to perform the processes described in this disclosure. Of course, the tuning controller 1200 may operate in conjunction with other computers, including but not limited to, general purpose computers continuously, intermittently or selectively coupled to the tuning controller to supervise, monitor, configure, troubleshoot, exchange data, assist, visualize, and perform other operations related to the operation of the tuning controller.

The tuning controller 1120 may therefore be any type of suitable dedicated, special purpose industrial computer identified above also including random-access memory ("RAM"), read-only memory ("ROM"), and other appropriate components, or any other appropriately configured controller for this particular purpose. All such devices include a processor and computer-readable memory storing non-transitory computer instructions that, when executed by the processor, causes the processor to perform the processes described in this disclosure. Of course, the tuning controller 1200 may operate in conjunction with other computers, including but not limited to, general purpose computers continuously, intermittently or selectively coupled to the tuning controller to supervise, monitor, configure, troubleshoot, exchange data, assist, visualize, and perform other operations related to the operation of the tuning controller.

In alternative embodiments, the hardware processors described in this disclosure may be, for example and without limitation, a microcontroller, a central processing unit ("CPU"), a digital signal processor ("DSP"), a programmed logic array ("PLA"), or a custom processing circuit. Instructions may be executed by one or more processors, such as one or more central processing units ("CPU"), digital signal processors ("DSPs"), general purpose microprocessors, application specific integrated circuits ("ASICs"), field programmable logic arrays ("FPGAs"), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements. A "controller," including one or more processors, may use electrical signals and digital algorithms to perform its receptive, analytic, and control functions, which may further include corrective functions. Thus, a controller is a specific type of processing circuitry, comprising one or more processors and memory, that implements control functions by way of generating control signals.

A computer-readable media may be any available media that may be accessed by a computer. By way of example, computer-readable media include random access memory ("RAM"), read-only memory ("ROM"), electrically-erasable/programmable read-only memory ("EEPROM"), compact disc ROM ("CD-ROM") or other optical disk storage, magnetic disk storage or other magnetic storage devices, or any other medium that may be used to carry or store desired program code in the form of instructions or data structures and that may be accessed by a computer. Disk and disc, as used herein, includes compact disc ("CD"), laser disc, optical disc, digital versatile disc ("DVD"), floppy disk and Blu-ray® disc where disks usually reproduce data magnetically, while discs reproduce data optically with lasers.

Note also that the software implemented aspects of the subject matter hereof are usually encoded on some form of program storage medium or implemented over some type of transmission medium. The program storage medium is a non-transitory medium and may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The claimed subject matter is not limited by these aspects of any given implementation.

In certain embodiments, advantages of the present disclosure may provide for computer executable instructions for improving repeatability of capacitor positions associated with matching networks in radio frequency plasma processing devices.

In certain embodiments, advantages of the present disclosure may provide improved repeatability of tuning of capacitors associated with matching networks in radio frequency plasma processing devices.

In certain embodiments, advantages of the present disclosure may provide a method for storing optimized capacitor positions for plasma processing conditions, which may increase the consistency of the capacitor trajectories.

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Those skilled in the art will appreciate that many modifications and variations are possible in view of the above disclosure. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

The invention claimed is:

1. A plasma generation system comprising:
a radio frequency generator characterized by a source impedance;
a plasma chamber characterized by a load impedance; and
a matching network coupled to the radio frequency generator and the plasma chamber characterized by a matching network impedance, wherein the matching network together with the plasma chamber is characterized by a combined load impedance;
the matching network further comprising a plurality of impedance control components and a tuning controller, wherein the tuning controller performs a method comprising:
driving the matching network to define a multi-dimensional tuning range for the matching network;
defining a plurality of target impedance values spaced apart throughout the multi-dimensional tuning range;
driving the matching network to produce a plurality of tuning values for the impedance control components for driving the impedance of the matching network proximate to the plurality of target impedance values;
driving the matching network to generate closest measured frame tuning values proximate to the target impedance values; and
computing interpolated tuning values between the measured frame tuning values, including performing an n-dimensional interpolation calculating the proximity of the interpolated impedances using the sum of reflection coefficient and normalized cartesian distance;
storing the tuning values mapped to corresponding matching network impedance values in a tuning database; and
operating the matching network by:

(a) measuring one or more of the matching network impedance, the load impedance, or the combined load impedance;
(b) computing a desired matching network impedance based on the matching network impedance, the load impedance, or the combined load impedance to match the combined load impedance with the source impedance;
(c) looking up a closest matching network impedance value proximate to the desired matching network impedance in the tuning database;
(d) looking up a set of tuning values corresponding to the closest matching network impedance value in the tuning database; and
(e) setting each impedance control component to its respective tuning value.

2. The plasma generation system of claim 1, further comprising the step of repeating steps (a) through (e) for a plurality of successive measurements of one or more of the matching network impedance, the load impedance, or the combined load impedance.

3. The plasma generation system of claim 1, wherein computing the interpolated tuning values comprises calculating a proximity of the interpolated impedances using a sum of reflection coefficient and normalized cartesian distance.

4. The plasma generation system of claim 1, wherein:
the matching network comprises a phase-shift inductor electrically connected in series between the RF generator and the plasma chamber; and
the impedance control components comprise:
a loading capacitor electrically connected in series between the RF generator and the phase-shift inductor; and
a tuning capacitor electrically connected in series between the phase-shift inductor and the plasma chamber.

5. The plasma generation system of claim 1, wherein the impedance control components comprise:
a variable phase-shift inductor electrically connected in series between the RF generator and the plasma chamber;
a loading capacitor electrically connected in series between the RF generator and the phase-shift inductor; and
a tuning capacitor electrically connected in series between the phase-shift inductor and the plasma chamber.

6. The plasma generation system of claim 1, wherein:
the matching network comprises a phase-shift inductor electrically connected in series between the RF generator and the plasma chamber; and
the impedance control components comprise:
a loading capacitor electrically connected in series between the RF generator and the phase-shift inductor;
a tuning capacitor electrically connected in series between the phase-shift inductor and the plasma chamber; and
one or more shunt control legs electrically connected to ground between an RF transmission line connected between the RF generator and the plasma generator.

7. The plasma generation system of claim 1, wherein:
the matching network comprises a phase-shift inductor electrically connected in series between the RF generator and the plasma chamber; and
the impedance control components comprise:
a loading capacitor electrically connected in series between the RF generator and the phase-shift inductor;

a tuning capacitor electrically connected in series between the phase-shift inductor and the plasma chamber;
a first shunt control leg electrically connected to ground between an RF transmission line connected between the RF generator and the phase-shift inductor;
a second shunt control leg electrically connected to ground between an RF transmission line connected between the phase-shift inductor and the plasma chamber.

8. A method for calibrating a matching network comprising a plurality of impedance control components coupled to a plasma chamber and a radio frequency generator in a plasma generating system, the radio frequency generator characterized by a source impedance, the matching network characterized by a matching network impedance, the plasma chamber characterized by a load impedance, and the matching network together with the plasma chamber characterized by a combined load impedance, comprising:
calibrating the matching network by:
driving the matching network to define a multi-dimensional tuning range for the matching network;
defining a plurality of target impedance values spaced apart throughout the multi-dimensional tuning range;
driving the matching network to produce a plurality of tuning values for the impedance control components for driving the impedance of the matching network proximate to the plurality of target impedance values;
driving the matching network to generate closest measured frame tuning values proximate to the target impedance values; and
computing interpolated tuning values between the measured frame tuning values, including performing an n-dimensional interpolation calculating the proximity of the interpolated impedances using the sum of reflection coefficient and normalized cartesian distance; and
storing the tuning values mapped to corresponding matching network impedance values in a tuning database; and
operating the matching network by:
(a) measuring one or more of the matching network impedance, the load impedance, or the combined load impedance;
(b) computing a desired matching network impedance based the matching network impedance, the load impedance, or the combined load impedance to match the combined load impedance with the source impedance;
(c) looking up a closest matching network impedance value proximate to the desired matching network impedance in the tuning database;
(d) looking up a set of tuning values corresponding to the closest matching network impedance value in the tuning database; and
(e) setting each impedance control component to its respective tuning value.

9. The method of claim 8, wherein the step of further comprising the step of repeating steps (a) through (e) for a plurality of successive measurements of one or more of the matching network impedance, the load impedance, or the combined load impedance.

10. The method of claim 8, wherein driving the matching network to produce the plurality of tuning values further comprises driving the matching network to generate closest measured frame tuning values proximate to the target impedance values.

11. The method of claim 8, wherein driving the matching network to produce the plurality of tuning values further comprises computing interpolated tuning values between the measured frame tuning values.

12. The method of claim 8, wherein computing the interpolated tuning values comprises performing an n-dimensional interpolation calculating the proximity of the interpolated impedances using the sum of reflection coefficient and normalized cartesian distance.

13. The method of claim 8, wherein computing the interpolated tuning values comprises calculating a proximity of the interpolated impedances using a sum of reflection coefficient and normalized cartesian distance.

14. The method of claim 8, wherein:
the matching network comprises a phase-shift inductor electrically connected in series between the RF generator and the plasma chamber; and
the impedance control components comprise:
a loading capacitor electrically connected in series between the RF generator and the phase-shift inductor; and
a tuning capacitor electrically connected in series between the phase-shift inductor and the plasma chamber.

15. The method of claim 8, wherein the impedance control components comprise:
a variable phase-shift inductor electrically connected in series between the RF generator and the plasma chamber;
a loading capacitor electrically connected in series between the RF generator and the phase-shift inductor; and
a tuning capacitor electrically connected in series between the phase-shift inductor and the plasma chamber.

16. The method of claim 8, wherein:
the matching network comprises a phase-shift inductor electrically connected in series between the RF generator and the plasma chamber; and
the impedance control components comprise:
a loading capacitor electrically connected in series between the RF generator and the phase-shift inductor;
a tuning capacitor electrically connected in series between the phase-shift inductor and the plasma chamber; and
one or more shunt control legs electrically connected to ground between an RF transmission line connected between the RF generator and the plasma generator.

17. The method of claim 8, wherein:
the matching network comprises a phase-shift inductor electrically connected in series between the RF generator and the plasma chamber; and
the impedance control components comprise:
a loading capacitor electrically connected in series between the RF generator and the phase-shift inductor;
a tuning capacitor electrically connected in series between the phase-shift inductor and the plasma chamber;
a first shunt control leg electrically connected to ground between an RF transmission line connected between the RF generator and the phase-shift inductor; and
a second shunt control leg electrically connected to ground between an RF transmission line connected between the phase-shift inductor and the plasma chamber.

* * * * *